US012809084B2

(12) United States Patent
Hsia et al.

(10) Patent No.: US 12,809,084 B2
(45) Date of Patent: Nov. 24, 2026

(54) SEMICONDUCTOR DEVICE AND METHODS OF MANUFACTURE

(71) Applicant: Taiwan Semiconductor Manufacturing Co., Ltd., Hsinchu (TW)

(72) Inventors: Hsing-Kuo Hsia, Jhubei (TW); Chen-Hua Yu, Hsinchu (TW); Chih-Wei Tseng, Hsinchu (TW); Jui Lin Chao, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 581 days.

(21) Appl. No.: 18/178,229

(22) Filed: Mar. 3, 2023

(65) Prior Publication Data

US 2024/0113056 A1 Apr. 4, 2024

Related U.S. Application Data

(60) Provisional application No. 63/420,165, filed on Oct. 28, 2022, provisional application No. 63/378,117, filed on Oct. 3, 2022.

(51) Int. Cl.
*G02B 6/12* (2006.01)
*G02B 6/13* (2006.01)
(Continued)

(52) U.S. Cl.
CPC ........... *G02B 6/12004* (2013.01); *G02B 6/13* (2013.01); *H10B 80/00* (2023.02); *H10W 72/20* (2026.01);
(Continued)

(58) Field of Classification Search
CPC ......... H01L 21/486; H01L 2224/05022; H01L 2224/05124; H01L 2224/05562;
(Continued)

(56) References Cited

U.S. PATENT DOCUMENTS 5,420,722 A * 5/1995 Bielak .................. G02B 6/4204 359/708
6,095,697 A * 8/2000 Lehman ................. G02B 6/423 385/91

(Continued)

OTHER PUBLICATIONS

Chidambaram et al., Wafer Level Fine-Pitch Hybrid Bonding: Challenges and Remedies, 2020 IEEE 22nd Electronics Packaging Technology Conference (EPTC), pp. 459-463 (Year: 2020).*

(Continued)

*Primary Examiner* — Peter Radkowski
(74) *Attorney, Agent, or Firm* — Slater Matsil, LLP

(57) ABSTRACT

A semiconductor package including a first interposer comprising a first substrate, first optical components over the first substrate, a first dielectric layer over the first optical components, and first conductive connectors embedded in the first dielectric layer, a photonic package bonded to a first side of the first interposer, where a first bond between the first interposer and the photonic package includes a dielectric-to-dielectric bond between a second dielectric layer on the photonic package and the first dielectric layer, and a second bond between the first interposer and the photonic package includes a metal-to-metal bond between a second conductive connector on the photonic package and a first one of the first conductive connectors and a first die bonded to the first side of the first interposer.

20 Claims, 27 Drawing Sheets

45

(51) Int. Cl.

| | |
|---|---|
| ***H10B 80/00*** | (2023.01) |
| ***H10W 72/20*** | (2026.01) |
| ***H10W 90/00*** | (2026.01) |
| *H10W 72/30* | (2026.01) |
| *H10W 72/90* | (2026.01) |
| *H10W 74/15* | (2026.01) |
| *H10W 80/00* | (2026.01) |

(52) U.S. Cl.

CPC . *H10W 90/401* (2026.01); *G02B 2006/12061* (2013.01); *G02B 2006/12121* (2013.01); *G02B 2006/12123* (2013.01); *H10W 72/252* (2026.01); *H10W 72/354* (2026.01); *H10W 72/923* (2026.01); *H10W 72/941* (2026.01); *H10W 72/9415* (2026.01); *H10W 72/942* (2026.01); *H10W 72/951* (2026.01); *H10W 72/952* (2026.01); *H10W 74/15* (2026.01); *H10W 80/312* (2026.01); *H10W 80/327* (2026.01); *H10W 90/734* (2026.01); *H10W 90/792* (2026.01); *H10W 90/794* (2026.01)

(58) Field of Classification Search

CPC . H01L 2224/05571; H01L 2224/05624; H01L 2224/05647; H01L 2224/05666; H01L 2224/05684; H01L 2224/08147; H01L 2224/08237; H01L 2224/13109; H01L 2224/13111; H01L 2224/13116; H01L 2224/13124; H01L 2224/13139; H01L 2224/13144; H01L 2224/13147; H01L 2224/13155; H01L 2224/13164; H01L 2224/2919; H01L 2224/32225; H01L 2224/73204; H01L 2224/80357; H01L 2224/80379; H01L 2224/80895; H01L 2224/80896; H01L 2225/06534; H01L 23/147; H01L 23/49816; H01L 23/49833; H01L 23/5384; H01L 24/05; H01L 24/08; H01L 24/13; H01L 24/16; H01L 24/29; H01L 24/32; H01L 24/73; H01L 24/80; H01L 25/16; H01L 25/50; H01L 2924/0504; H01L 2924/0544; H01L 2924/05494; H01L 2924/0665; H01L 2924/07025; H01L 2924/1432; H01L 2924/1433; H01L 2924/14361; H01L 2924/1437; H10B 80/00; G02B 2006/12061; G02B 2006/12097; G02B 2006/12121; G02B 2006/12123; G02B 2006/12142; G02B 6/12004; G02B 6/13; G02B 6/136; G02B 6/34; G02B 6/3598; G02B 6/4214; G02B 6/4274

See application file for complete search history.

(56) References Cited

U.S. PATENT DOCUMENTS

| | | | | |
|---|---|---|---|---|
| 7,847,411 | B2 * | 12/2010 | Takaike | H01L 24/82 257/688 |
| 8,097,956 | B2 * | 1/2012 | von Kaenel | H01L 25/105 257/777 |
| 8,470,613 | B2 * | 6/2013 | von Kaenel | H01L 25/105 257/E21.531 |
| 8,829,656 | B2 * | 9/2014 | Zhao | H01L 23/147 257/E21.597 |
| 9,190,379 | B2 * | 11/2015 | Arnold | H01L 24/19 |
| 9,236,355 | B2 * | 1/2016 | Zhai | H01L 23/552 |
| 9,263,511 | B2 * | 2/2016 | Yu | H10D 1/68 |
| 9,297,971 | B2 * | 3/2016 | Thacker | G02B 6/4274 |
| 9,318,474 | B2 * | 4/2016 | Zhai | H01L 25/50 |
| 9,367,094 | B2 * | 6/2016 | Bibl | H01L 25/167 |
| 9,372,206 | B2 * | 6/2016 | Wu | G01R 31/2896 |
| 9,461,018 | B1 * | 10/2016 | Tsai | H01L 23/3128 |
| 9,496,189 | B2 * | 11/2016 | Yu | H01L 22/20 |
| 9,548,288 | B1 * | 1/2017 | Ramachandran | H01L 25/16 |
| 9,559,081 | B1 * | 1/2017 | Lai | H01L 25/0657 |
| 9,570,883 | B2 * | 2/2017 | Zarbock | G02B 6/4214 |
| 9,582,036 | B2 * | 2/2017 | Bibl | H01L 25/167 |
| 9,583,462 | B2 * | 2/2017 | Lee | H01L 23/5389 |
| 9,583,472 | B2 * | 2/2017 | Chung | H01L 23/5389 |
| 9,589,936 | B2 * | 3/2017 | Zhai | H01L 21/561 |
| 9,601,471 | B2 * | 3/2017 | Zhai | H01L 25/105 |
| 9,633,974 | B2 * | 4/2017 | Zhai | H01L 21/568 |
| 9,659,907 | B2 * | 5/2017 | Zhai | H01L 21/561 |
| 9,679,801 | B2 * | 6/2017 | Lai | H01L 25/50 |
| 9,691,701 | B2 * | 6/2017 | Zhai | H10D 1/20 |
| 9,721,903 | B2 * | 8/2017 | Lee | H01L 23/552 |
| 9,735,131 | B2 * | 8/2017 | Su | H01L 25/105 |
| 9,768,145 | B2 * | 9/2017 | Yu | H01L 25/0652 |
| 9,786,641 | B2 * | 10/2017 | Budd | H01L 25/167 |
| 9,847,284 | B2 * | 12/2017 | Zhai | H01L 23/498 |
| 9,875,911 | B2 * | 1/2018 | Pagaila | H01L 21/568 |
| 9,922,966 | B2 * | 3/2018 | Bibl | H01L 25/167 |
| 9,935,087 | B2 * | 4/2018 | Zhai | H01L 25/105 |
| 10,056,327 | B2 * | 8/2018 | Zhai | H10D 1/20 |
| 10,082,633 | B2 * | 9/2018 | Schaevitz | G02B 6/4228 |
| 10,115,677 | B2 * | 10/2018 | Lee | H01L 23/552 |
| 10,147,711 | B2 * | 12/2018 | Bibl | H01L 25/167 |
| 10,181,455 | B2 * | 1/2019 | Zhai | H01L 25/0657 |
| 10,267,988 | B2 * | 4/2019 | Huang | G02B 6/13 |
| 10,267,990 | B1 * | 4/2019 | Yu | G02B 6/124 |
| 10,332,937 | B2 * | 6/2019 | Furuya | H01L 23/13 |
| 10,371,893 | B2 * | 8/2019 | Yu | G02B 6/124 |
| 10,459,159 | B2 * | 10/2019 | Huang | G02B 6/4239 |
| 10,483,253 | B1 * | 11/2019 | Hu | H01L 23/5389 |
| 10,515,827 | B2 * | 12/2019 | Jeng | H01L 25/105 |
| 10,522,475 | B2 * | 12/2019 | Lee | H01L 23/552 |
| 10,535,597 | B2 * | 1/2020 | Chen | H01L 23/49827 |
| 10,535,642 | B2 * | 1/2020 | Bibl | H01L 25/167 |
| 10,586,909 | B2 * | 3/2020 | Das | H01L 23/5384 |
| 10,602,612 | B1 * | 3/2020 | Hoang | H05K 3/284 |
| 10,624,214 | B2 * | 4/2020 | Salehi | H05K 1/0224 |
| 10,631,410 | B2 * | 4/2020 | Provencher | H05K 3/0014 |
| 10,698,156 | B2 * | 6/2020 | Coolbaugh | G02B 6/12 |
| 10,742,217 | B2 * | 8/2020 | Dabral | H01L 24/20 |
| 10,756,622 | B2 * | 8/2020 | Dabral | G05F 3/10 |
| 10,770,433 | B1 * | 9/2020 | Zhong | H01L 25/105 |
| 10,784,220 | B2 * | 9/2020 | Jeng | H01L 21/6835 |
| 10,825,696 | B2 * | 11/2020 | Yu | H01L 21/561 |
| 10,847,468 | B2 * | 11/2020 | Kim | H01L 23/5385 |
| 10,867,925 | B2 * | 12/2020 | Jeng | H01L 21/568 |
| 10,886,263 | B2 * | 1/2021 | Chen | H01L 23/5384 |
| 10,910,321 | B2 * | 2/2021 | Hsieh | H01L 23/3677 |
| 10,943,869 | B2 * | 3/2021 | Zhai | H01L 24/19 |
| 10,950,591 | B2 * | 3/2021 | Hu | H01L 25/167 |
| 10,957,678 | B2 * | 3/2021 | Bibl | H01L 25/167 |
| 10,993,317 | B2 * | 4/2021 | He | H01L 25/167 |
| 11,031,381 | B2 * | 6/2021 | Chen | H01L 21/56 |
| 11,049,841 | B2 * | 6/2021 | Bernier | H01L 23/552 |
| 11,056,373 | B2 * | 7/2021 | Zhai | H01L 23/5389 |
| 11,063,013 | B2 * | 7/2021 | Chen | H01L 23/5386 |
| 11,069,665 | B2 * | 7/2021 | Ramachandran | H01L 22/20 |
| 11,133,296 | B2 * | 9/2021 | Jeong | H01L 25/105 |
| 11,150,404 | B2 * | 10/2021 | Huang | G02B 6/428 |
| 11,183,474 | B2 * | 11/2021 | Lu | H01L 25/0657 |
| 11,257,763 | B2 * | 2/2022 | Lu | H01L 23/5384 |
| 11,264,345 | B2 * | 3/2022 | Enquist | H01L 25/0657 |
| 11,270,956 | B2 * | 3/2022 | Huang | H01L 23/562 |
| 11,309,895 | B2 * | 4/2022 | Dabral | H01L 24/20 |
| 11,313,741 | B2 * | 4/2022 | Lupo | G01K 13/20 |
| 11,315,805 | B2 * | 4/2022 | Yu | H01L 21/561 |
| 11,322,453 | B2 * | 5/2022 | Hsu | H01L 21/6835 |
| 11,347,001 | B2 * | 5/2022 | Chen | G02B 6/30 |
| 11,362,076 | B2 * | 6/2022 | Bibl | H01L 25/167 |
| 11,374,381 | B1 * | 6/2022 | Kriman | H10H 20/853 |
| 11,387,177 | B2 * | 7/2022 | Chien | H01L 23/5389 |
| 11,462,461 | B2 * | 10/2022 | Zhang | H01L 23/49816 |
| 11,493,713 | B1 * | 11/2022 | Mendoza | G02B 6/12002 |
| 11,493,714 | B1 * | 11/2022 | Mendoza | G02B 6/12002 |
| 11,508,692 | B2 * | 11/2022 | Yeh | H01L 24/97 |

(56) References Cited

U.S. PATENT DOCUMENTS 11,515,261 B2 * 11/2022 Shanmugam ......... H01L 21/568
11,532,563 B2 * 12/2022 Shanmugam ....... H01L 23/5389
11,545,438 B2 * 1/2023 Hsieh .................. H01L 21/6835
11,550,108 B1 * 1/2023 Mendoza ........... G02B 6/12002
11,587,909 B2 * 2/2023 Zhong ................... H01L 25/105
11,594,494 B2 * 2/2023 Zhai ........................ H01L 24/19
11,610,864 B2 * 3/2023 Chen ................. H01L 23/49816
11,651,976 B2 * 5/2023 Renjan .................. H01L 23/295
257/676
11,676,953 B2 * 6/2023 Bibi ...................... H01L 25/167
257/82
11,694,939 B2 * 7/2023 Huang ................ H01L 23/3185
257/787
11,728,266 B2 * 8/2023 Dabral .................. H01L 23/522
257/737
11,764,123 B2 * 9/2023 Huang ................ H01L 23/3185
257/787
11,817,383 B2 * 11/2023 Lupo ...................... G01K 13/20
11,824,029 B2 * 11/2023 Chen ................... H01L 23/5386
11,831,312 B2 * 11/2023 Dabral .................... H01L 24/20
11,837,566 B2 * 12/2023 Lu ....................... H01L 25/0657
11,841,541 B2 * 12/2023 Chang .................. G02B 6/4274
11,846,802 B2 * 12/2023 Chen .................... G02B 6/4295
11,881,678 B1 * 1/2024 Bishop .................... H01S 5/405
11,892,693 B1 * 2/2024 Mendoza ........... G02B 6/12002
11,908,706 B2 * 2/2024 Yu ......................... H01L 21/561
12,046,558 B2 * 7/2024 Lu ....................... H01L 23/5384
12,074,077 B2 * 8/2024 Shanmugam ......... H01L 21/568
12,074,244 B2 * 8/2024 Liu ....................... G06F 1/1635
12,087,749 B2 * 9/2024 Bibl ...................... H01L 25/167
12,119,304 B2 * 10/2024 Dabral ................ H01L 23/5384
12,197,023 B1 * 1/2025 Aggarwal ............ G02B 6/4255
12,210,187 B2 * 1/2025 Chen ................... H01L 23/5386
12,230,513 B2 * 2/2025 Yu ......................... H01L 21/561
12,242,123 B1 * 3/2025 Mendoza ........... G02B 6/12002
12,283,549 B2 * 4/2025 Zhai ........................ H01L 24/19
12,368,137 B2 * 7/2025 Zhong ................... H01L 25/105
12,392,974 B2 * 8/2025 Aggarwal ................ G02B 6/32
12,405,434 B2 * 9/2025 Aggarwal .............. G02B 6/124
12,431,453 B2 * 9/2025 Lu ....................... H01L 25/0657
2005/0280141 A1 * 12/2005 Zhang ..................... H01L 23/36
257/E23.101
2007/0158832 A1 * 7/2007 Takaike .................. H01L 24/82
257/734
2010/0078635 A1 * 4/2010 Kuroda ................... H01L 25/18
438/107
2010/0230825 A1 * 9/2010 von Kaenel .......... H01L 25/105
257/777
2010/0327424 A1 * 12/2010 Braunisch ........... H01L 23/5385
257/692
2011/0044367 A1 * 2/2011 Budd .................... H10F 39/107
257/E31.127
2011/0068459 A1 * 3/2011 Pagaila ................. H01L 21/568
257/E23.141
2012/0083052 A1 * 4/2012 von Kaenel .......... H01L 25/105
257/E21.531
2013/0084039 A1 * 4/2013 Doany .................. H01L 21/302
438/31
2014/0029639 A1 * 1/2014 Zarbock ............... G02B 6/4214
372/50.1
2014/0061946 A1 * 3/2014 Zhao ..................... H01L 23/147
257/774
2014/0084425 A1 * 3/2014 Arnold .................... H01L 24/19
257/738
2014/0210106 A1 * 7/2014 Zhai .................... H01L 23/3128
438/118
2014/0210107 A1 * 7/2014 Zhai ...................... H01L 23/498
257/777
2014/0225222 A1 * 8/2014 Yu ............................ H10D 1/68
257/532
2014/0269804 A1 * 9/2014 Lai ..................... G02B 6/12004
372/50.21
2014/0321804 A1 * 10/2014 Thacker ............... G02B 6/4274
385/14
2015/0169011 A1 * 6/2015 Bibl ...................... H01L 25/167
345/175
2015/0171063 A1 * 6/2015 Zhai ........................ H01L 25/50
257/713
2015/0296622 A1 * 10/2015 Jiang ...................... H05K 1/028
361/749
2015/0303149 A1 * 10/2015 Zhai ...................... H01L 23/552
257/659
2016/0148904 A1 * 5/2016 Zhai ...................... H01L 21/561
438/109
2016/0155723 A1 * 6/2016 Lou ..................... H01L 25/0652
257/774
2016/0218082 A1 * 7/2016 Lee ..................... H01L 23/5389
2016/0259368 A1 * 9/2016 Bibl ...................... H01L 25/167
2016/0260684 A1 * 9/2016 Zhai ...................... H01L 21/568
2016/0260695 A1 * 9/2016 Chung ................ H01L 23/5389
2016/0270213 A1 * 9/2016 Salehi .................... B33Y 80/00
2016/0300813 A1 * 10/2016 Zhai ...................... H01L 21/561
2016/0315071 A1 * 10/2016 Zhai ...................... H01L 25/105
2016/0358889 A1 * 12/2016 Lai .......................... H01L 25/50
2016/0379959 A1 * 12/2016 We ...................... H01L 25/0655
257/773
2017/0018497 A1 * 1/2017 Zhai ......................... H10D 1/20
2017/0025380 A1 * 1/2017 Zhai .................... H01L 23/5389
2017/0031115 A1 * 2/2017 Schaevitz ............ G02B 6/4228
2017/0047312 A1 * 2/2017 Budd ................... G02B 6/1221
2017/0053897 A1 * 2/2017 Lai ...................... H01L 25/0657
2017/0062383 A1 * 3/2017 Yee ..................... H01L 25/0652
2017/0062390 A1 * 3/2017 Chua ..................... H01L 21/561
2017/0108655 A1 * 4/2017 Zarbock ............... G02B 6/4214
2017/0141088 A1 * 5/2017 Zhai ...................... H01L 25/105
2017/0141091 A1 * 5/2017 Bibl ...................... H01L 25/167
2017/0179039 A1 * 6/2017 Lee ....................... H01L 23/552
2017/0199328 A1 * 7/2017 Shubin ................. G02B 6/1228
2017/0256489 A1 * 9/2017 Zhai ......................... H10D 1/20
2017/0301631 A1 * 10/2017 Lee ....................... H01L 23/552
2017/0358552 A1 * 12/2017 Breiner ................. H01L 23/552
2018/0092213 A1 * 3/2018 Provencher .......... H05K 3/0014
2018/0102470 A1 * 4/2018 Das ..................... H01L 23/5384
2018/0175113 A1 * 6/2018 Furuya .................... H01L 23/13
2018/0190632 A1 * 7/2018 Bibl ...................... H01L 25/167
2018/0204791 A1 * 7/2018 Chen ................. H01L 23/49827
2018/0204820 A1 * 7/2018 Zhai .................... H01L 25/0657
2018/0286824 A1 * 10/2018 Jeng .................... H01L 21/6835
2018/0314003 A1 * 11/2018 Coolbaugh .............. G02B 6/12
2018/0358298 A1 * 12/2018 Zhai ........................ H01L 24/19
2018/0372968 A1 * 12/2018 McKay ................... H01S 5/183
2019/0004247 A1 * 1/2019 Huang ............... G02B 6/12002
2019/0027445 A1 * 1/2019 Lee ....................... H01L 23/552
2019/0043845 A1 * 2/2019 Bibl ...................... H01L 25/167
2019/0057932 A1 * 2/2019 Wu ......................... H01L 23/04
2019/0103386 A1 * 4/2019 Chen ................... H01L 23/5384
2019/0131284 A1 * 5/2019 Jeng ...................... H01L 25/105
2019/0162901 A1 * 5/2019 Yu .......................... G02B 6/124
2019/0164905 A1 * 5/2019 Hsieh .................. H01L 23/3677
2019/0237419 A1 * 8/2019 Enquist ............... H01L 25/0657
2019/0250327 A1 * 8/2019 Huang ................. G02B 6/4274
2019/0319626 A1 * 10/2019 Dabral .................... H01L 24/20
2019/0369329 A1 * 12/2019 Huang ...................... G02B 6/34
2020/0006089 A1 * 1/2020 Yu ......................... H01L 21/561
2020/0027837 A1 * 1/2020 Jeng ...................... H01L 21/568
2020/0043853 A1 * 2/2020 Kim .................... H01L 23/5385
2020/0098734 A1 * 3/2020 Jeong .................... H01L 25/105
2020/0107435 A1 * 4/2020 He ......................... H01L 25/167
2020/0135707 A1 * 4/2020 Chen ....................... H01L 21/56
2020/0161288 A1 * 5/2020 Bibl ...................... H01L 25/167
2020/0176427 A1 * 6/2020 Ramachandran ....... H01L 22/14
2020/0204067 A1 * 6/2020 Dabral ....................... G05F 3/10
2020/0258875 A1 * 8/2020 Hu ........................ H01L 25/167
2020/0273843 A1 * 8/2020 Zhong ................... H01L 25/105
2020/0365544 A1 * 11/2020 Chen ................... H01L 23/5386
2020/0389172 A1 * 12/2020 Dabral .................... H01L 24/20
2020/0395281 A1 * 12/2020 Chien ................. H01L 23/3114
2021/0020610 A1 * 1/2021 Zhong ................... H01L 25/105
2021/0074553 A1 * 3/2021 Yu ......................... H01L 21/561
2021/0074682 A1 * 3/2021 Chen ................. H01L 23/49816

(56) References Cited

U.S. PATENT DOCUMENTS

2021/0090908 A1* 3/2021 Renjan .................. H01L 23/295
2021/0096310 A1* 4/2021 Chang .................. G02B 6/4274
2021/0134751 A1* 5/2021 Lu ....................... H01L 25/0657
2021/0151411 A1* 5/2021 Cho ........................ H01L 24/06
2021/0159180 A1* 5/2021 Zhai ........................ H01L 24/19
2021/0159185 A1* 5/2021 Hsu ..................... H01L 21/6835
2021/0167016 A1* 6/2021 Lu ....................... H01L 23/5384
2021/0181039 A1* 6/2021 Lupo ...................... G01K 13/20
2021/0202389 A1* 7/2021 Hsieh .................. H01L 21/6835
2021/0202436 A1* 7/2021 Yeh ......................... H01L 24/13
2021/0265330 A1* 8/2021 Bibl ...................... H01L 25/167
2021/0305173 A1* 9/2021 Huang .................. H01L 23/562
2021/0311252 A1* 10/2021 Chen ........................ G02B 6/30
2021/0343671 A1* 11/2021 Chen ................... H01L 23/5386
2021/0366802 A1* 11/2021 Huang .................. H01L 25/167
2021/0384113 A1* 12/2021 Zhang ............... H01L 23/49816
2022/0071013 A1* 3/2022 Morrison ............... H05K 1/181
2022/0084972 A1* 3/2022 Lu ....................... H01L 25/0657
2022/0085231 A1* 3/2022 Liu ........................ G04G 17/04
2022/0093522 A1* 3/2022 Shanmugam ....... H01L 23/5389
2022/0093523 A1* 3/2022 Shanmugam ........... H10F 77/93
2022/0102280 A1* 3/2022 Dabral ................ H01L 23/5384
2022/0157680 A1* 5/2022 Shanmugam ......... H01L 21/568
2022/0181264 A1* 6/2022 Lu ....................... H01L 23/5384
2022/0199517 A1* 6/2022 Dabral .................. H01L 23/522
2022/0231687 A1* 7/2022 Dabral .................... H01L 24/20
2022/0254656 A1* 8/2022 Yu ......................... H01L 21/561
2022/0260776 A1* 8/2022 Chen ................... H01L 23/5386
2022/0270955 A1* 8/2022 Lupo ...................... G01K 13/20
2022/0278086 A1* 9/2022 Bibl ...................... H01L 25/167
2022/0336309 A1* 10/2022 Huang .................. H01L 25/167
2023/0154897 A1* 5/2023 Zhong ................... H01L 25/105
257/419
2023/0223348 A1* 7/2023 Zhai ........................ H01L 24/19
257/737
2023/0361098 A1* 11/2023 Bibl ...................... H01L 25/167
2024/0085619 A1* 3/2024 Chen ................... H01L 23/5386
2024/0113061 A1* 4/2024 Lu ....................... H01L 25/0657
2024/0145257 A1* 5/2024 Yu ......................... H01L 21/561
2024/0379567 A1* 11/2024 Lu ....................... H01L 23/5384

OTHER PUBLICATIONS

Li et al., Wafer Level Back to Back Hybrid Bonding for Multiple Wafer Stacking, IEEE 22nd Electronics Packaging Technology Conference (EPTC), pp. 468-471 (Year: 2020).*

Theil et al., Recent Developments in Fine Pitch Wafer-to-Wafer Hybrid Bonding with Copper Interconnect, 2019 International Wafer Level Packaging Conference (IWLPC), pp. 1-6, (Year: 2019).*

Duan et al., A novel 3D stacking method for Opto-electronic dies on CMOS ICs, Opt. Express 20, B386-B392 (2012) (Year: 2012).*

Grabherr et al., VCSEL arrays for high-aggregate bandwidth of up to 1.34 Tbps, Proc. SPIE 9001, Vertical-Cavity Surface-Emitting Lasers XVIII, 900105 (Feb. 27, 2014); https://doi.org/10.1117/12.2039226 (Year: 2014).*

Ro et al., Evaluating the Impact of Optical Interconnects on a Multi-Chip Machine-Learning Architecture, Electronics 2018, 7, 130; doi: 10.3390/electronics7080130 (Year: 2018).*

Luo et al., DaDianNao: A Neural Network Supercomputer, IEEE Transactions on Computers, vol. 66, No. 1, Jan. 2017 (Year: 2017).*

Lin et al., Demonstration of an Optical Chip-to-Chip Link in a 3D Integrated Electronic-Photonic Platform, Technical Report No. UCB/EECS-2017-193 http://www2.eecs.berkeley.edu/Pubs/TechRpts/2017/EECS-2017-193.html (Year: 2017).*

Stojanović et al., "High-density 3D electronic-photonic integration," 2015 Fourth Berkeley Symposium on Energy Efficient Electronic Systems (E3S), Berkeley, CA, USA, 2015, pp. 1-2, doi: 10.1109/E3S.2015.7336803. (Year: 2015).*

Lau, John H., State-of-the-Art and Outlooks of Chiplets Heterogeneous Integration and Hybrid Bonding, IMAPS 2021—54th International Symposium on Microelectronics (Year: 2021).*

* cited by examiner

10

10

10

10

10

10

40

SEMICONDUCTOR DEVICE AND METHODS OF MANUFACTURE

PRIORITY CLAIM AND CROSS-REFERENCE

This application claims the benefits of U.S. Provisional Application No. 63/378,117, filed on Oct. 3, 2022 and entitled "Dual Interposer Integration for ASIC, COUPE and Memory Dies to Improve the Transmission Speed of Each Functional Die," and U.S. Provisional Application No. 63/420,165, filed on Oct. 28, 2022 and entitled "Semiconductor Device and Methods of Manufacture," which applications are hereby incorporated herein by reference in their entireties.

BACKGROUND

Electrical signaling and processing are one technique for signal transmission and processing. Optical signaling and processing have been used in increasingly more applications in recent years, particularly due to the use of optical fiber-related applications for signal transmission.

Optical signaling and processing are typically combined with electrical signaling and processing to provide full-fledged applications. For example, optical fibers may be used for long-range signal transmission, and electrical signals may be used for short-range signal transmission as well as processing and controlling. Accordingly, devices integrating long-range optical components and short-range electrical components are formed for the conversion between optical signals and electrical signals, as well as the processing of optical signals and electrical signals. Packages thus may include both optical (photonic) dies including optical devices and electronic dies including electronic devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
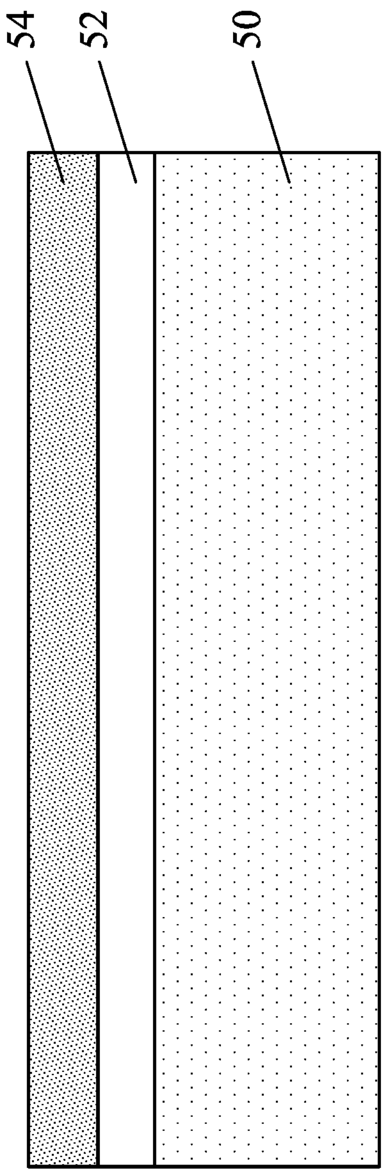
FIGS. 1 through 8 illustrate cross-sectional views of a photonic package at various stages of manufacturing, in accordance with an embodiment.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide methods applied to, but not limited to, the formation of an integrated circuit package that includes a first integrated circuit device and a second integrated circuit device bonded to a first interposer using both metal-to-metal bonding and dielectric-to-dielectric bonding, the first interposer also comprising a silicon nitride (SiN) waveguide that enables optical communication between the first integrated circuit device and the second integrated circuit device. The second integrated circuit device may comprise an electronic integrated chip (EIC) over a photonic integrated circuit (PIC). A memory device and the first interposer are also coupled to a second interposer using microbumps, Advantageous features of one or more embodiments disclosed herein may include the metal-to-metal bonds and dielectric-to-dielectric bonds allowing for faster signal and data transmission rates between the first integrated circuit device, the second integrated circuit device, and the memory device, with reduced power consumption during data and signal transmission. In addition, the use of microbumps also allows for improved signal and data transmission rates accompanied by reduced power consumption.

Further, using microbumps as a bonding interconnect to couple the elements of the integrated circuit package allows for a reduction in size of the bonding interconnects between the elements, and consequently allows for a reduced size of the integrated circuit package.

The embodiments described herein may be applied to, but are not limited to, embodiments that include a chip-on-wafer-on-substrate (CoWoS)® package that comprises a photonic engine, or the like.

FIGS. 1 through 8 illustrate cross-sectional views of a package component 10 at various stages of manufacturing, in accordance with an embodiment. The package component 10 (also referred to as an optical engine or a photonic package) may be part of a semiconductor package (e.g., the package 45 described below with reference to FIG. 20, or the like). In some embodiments, the package component 10 provides an input/output (I/O) interface between optical signals and electrical signals in a semiconductor package. In some embodiments, the package component 10 provides an optical network for signal communication between components (e.g., photonic devices, integrated circuits, couplings to external fibers, etc.) within the package 45, or the like.

With reference now to FIG. 1, there is illustrated an initial structure of an optical interposer 51 (seen in FIG. 4), in accordance with some embodiments. In the particular embodiment illustrated in FIG. 1, the optical interposer 51 comprises at this stage a substrate 50, an insulator layer 52, and silicon layer 54 for a first active layer 63 of first optical components 39 (not separately illustrated in FIG. 1 but illustrated and discussed further below with respect to FIG. 2). In an embodiment, at a beginning of the manufacturing process of the optical interposer 51, the substrate 50, the insulator layer 52, and the silicon layer 54 may collectively be part of a silicon-on-insulator (SOI) substrate.

The substrate 50 may be, for example, a material such as a glass, ceramic, dielectric, a semiconductor, the like, or a combination thereof. In some embodiments, the substrate 50 may be a semiconductor substrate, such as a bulk semiconductor or the like, which may be doped (e.g., with a p-type or an n-type dopant) or undoped. The substrate 50 may be a wafer, such as a silicon wafer (e.g., a 12-inch silicon wafer). Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The insulator layer 52 is formed over the substrate 50 and may be a dielectric layer that separates the substrate 50 from the overlying first active layer 63 and can additionally, in some embodiments, serve as a portion of cladding material that surrounds the subsequently manufactured first optical components 39 (discussed further below). In an embodiment the insulator layer 52 may be silicon oxide, silicon nitride, germanium oxide, germanium nitride, combinations of these, or the like, formed using a method such as implantation (e.g., to form a buried oxide (BOX) layer). For example, an implantation process may be performed on a bulk semiconductor substrate (e.g., comprising silicon) to form the buried insulator layer 52 (e.g., comprising silicon oxide) at a given depth below a top surface of the bulk semiconductor substrate. The insulator layer 52 is therefore disposed between a top portion of the bulk semiconductor substrate (e.g., the silicon layer 54) and a bottom portion of the bulk semiconductor substrate (e.g., the substrate 50 that comprises silicon). In other embodiments, the insulator layer 52 may be deposited onto the substrate 50 using a deposition method such as chemical vapor deposition, atomic layer deposition, physical vapor deposition, combinations of these, or the like. However, any suitable material and method of manufacture may be used.

Figure 2:
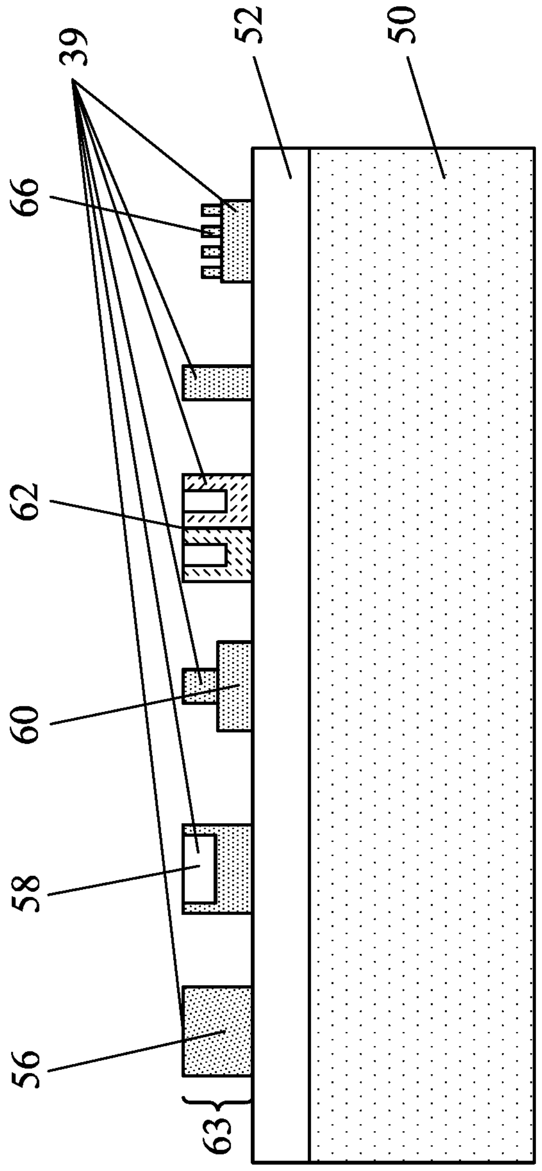

In FIG. 2, the silicon layer 54 is patterned to form the first active layer 63, the first active layer 63 comprising first optical components 39 that form a photonic integrated circuit (PIC), such as optical waveguides (e.g., ridge waveguides, rib waveguides, buried channel waveguides, diffused waveguides, slab waveguides etc.), couplers (e.g., grating couplers, edge couplers, etc.), optical switches (e.g., Mach-Zehnder silicon-photonic switches, microelectromechanical switches, micro-ring resonators, etc.), amplifiers, multiplexors, demultiplexors, optical-to-electrical converters (e.g., P—N junctions), electrical-to-optical converters, lasers, combinations of these, or the like. For example, the silicon layer 54 may be patterned to form waveguide 56 and slab waveguide 60, in accordance with some embodiments. In addition, the silicon layer 54 can be patterned to form silicon regions for further photonic components such as modulators (e.g., a germanium modulator 58 and a P—N modulator 62, or the like) and couplers (e.g., a coupler 66). The silicon layer 54 may be patterned using suitable photolithography and etching techniques. For example, a hardmask layer (e.g., a nitride layer or other dielectric material, not shown in FIG. 2) may be formed over the silicon layer 54 and patterned, in some embodiments. The pattern of the hardmask layer may then be transferred to the silicon layer 54 using one or more etching techniques, such as dry etching and/or wet etching techniques. For example, the silicon layer 54 may be etched to form recesses defining the waveguide 56 and the slab waveguide 60, with sidewalls of the remaining unrecessed or partially recessed portions defining sidewalls of the waveguide 56 and the slab waveguide 60. In some embodiments, more than one photolithography and etching sequence may be used in order to pattern the silicon layer 54. One of each waveguide 56 and 60, or multiple of each waveguides 56 and 60 may be patterned from the silicon layer 54. If multiple waveguides are formed, the multiple waveguides may be individual separate waveguides or connected as a single continuous structure. In some embodiments, one or more of the waveguides form a continuous loop. The slab waveguides 60 may be used to guide electromagnetic waves with minimal loss of energy by restricting the transmission of energy to two dimensions.

During the patterning of the silicon layer 54 described above, additional photonic components of the first optical components 39, such as the modulators 58 and 62, and one or more of the couplers 66 may also be formed. In other embodiments, the additional photonic components that utilize further manufacturing processes, such as switches that utilize resistive heating elements, additional processing may be performed either before or after the patterning of the silicon layer 54. These photonic components may be integrated and optically coupled with the waveguides 56 and 60 to interact with optical signals within the waveguides 56 and 60. The photonic components may also include, for example, photodetectors. For example, a photodetector may be optically coupled to the waveguides 56 and 60 to detect optical signals within the waveguides 56 and 60, and to generate electrical signals corresponding to the optical signals. Modulators may be optically coupled to the waveguides 56 and 60 to receive electrical signals and generate corresponding optical signals within the waveguides 56 and 60 by modulating optical power within the waveguides 56 and 60. In this manner, the photonic components facilitate the input/output (I/O) of optical signals to and from the waveguides 56 and 60. The modulators may include the germanium modulator 58 formed by, for example, partially etching regions of the silicon layer 54 and growing an epitaxial material on the remaining silicon of the etched regions. The silicon layer 54 may be etched using acceptable photolithography and etching techniques. The epitaxial material may comprise, for example, a semiconductor material such as germanium (Ge), which may be doped or undoped. The modulators may also include a P—N modulator 62, which is formed by performing one or more implantation processes to introduce dopants within the silicon of the remaining etched regions of the silicon layer 54 after the patterning of the silicon layer 54. The silicon of the etched regions may be doped with p-type dopants, n-type dopants, or a combination. In some embodiments, the etched regions used for the photodetectors and the etched regions used for the modulators may be formed using one or more of the same photolithography or etching steps.

In some embodiments, one or more couplers 66 may be integrated with the waveguides 56 and 60, and may be formed with the waveguides 56 and 60. The couplers 66 are photonic structures that allow optical signals and/or optical power to be transferred between the waveguides 56 and 60, and a photonic component such as an optical fiber 228 or a waveguide of another photonic system.

In some embodiments, the couplers 66 include grating couplers, which allow optical signals and/or optical power to be transferred between the waveguides 56 and/or 60, and a photonic component that is vertically mounted over the package 45. A package 45 may include a single coupler 66, multiple couplers 66, or multiple types of couplers 66, in some embodiments. The couplers 66 may be formed using acceptable photolithography and etching techniques. In some embodiments, the couplers 66 are formed using the same photolithography or etching steps as the waveguides 56 and 60, and/or the photonic components. In other embodiments, the couplers 66 are formed after the waveguide 56, the slab waveguide 60, and/or the photonic components are formed.

Other configurations or arrangements of waveguides 56 and 60, photonic components, or the coupler 66 are possible. In some cases, the waveguides 56 and 60, the coupler 66, and the other photonic components of the first optical components 39 may also be collectively referred to as "the photonic layer."

Figure 3:
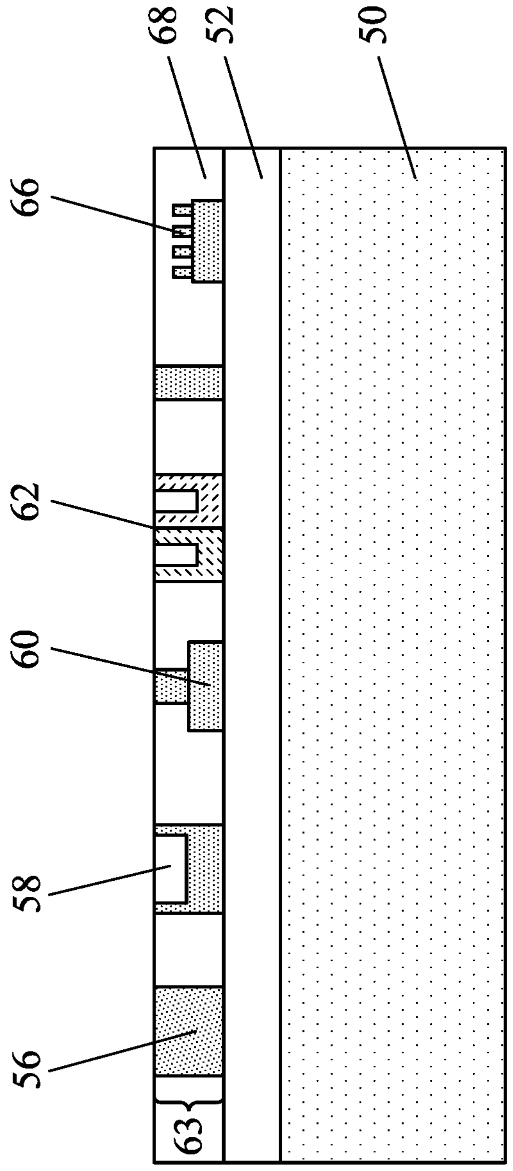

In FIG. 3, a dielectric layer 68 is formed over the first active layer 63, the insulator layer 52, and the substrate 50. The dielectric layer 68 is formed over the first active layer 63, such as over the waveguides 56 and 60, the germanium modulator 58, the P—N modulator 62, the coupler 66, the insulator layer 52, and other photonic components of the first optical components 39 formed over the insulator layer 52. The dielectric layer 68 may be formed of one or more layers of silicon oxide, silicon nitride, a combination thereof, or the like, and may be formed by CVD, PVD, atomic layer deposition (ALD), a spin-on-dielectric process, the like, or a combination thereof. In some embodiments, the dielectric layer 68 may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other dielectric materials formed by any acceptable process may be used. The dielectric layer 68 may be deposited to cover the first optical components 39 and separate the individual components of the first active layer 63 from each other and from the overlying structures. In alternative embodiments, the dielectric layer 68 may be planarized using a planarization process such as a CMP process, a grinding process, or the like. After the planarization process, top surfaces of the waveguide 56, the slab waveguide 60, the germanium modulator 58, and the P—N modulator 62 may be exposed.

The refractive index of the material of the waveguides 56 and 60 may be different to a refractive index of a material of the dielectric layer 68, and so the waveguides 56 and 60 may have high internal reflections such that light is substantially confined within the waveguides 56 and 60 depending on the wavelength of the light and the refractive indices of the respective materials. In an embodiment, the refractive index of the material of the waveguides 56 and 60 is higher than the refractive index of the material of the dielectric layer 68. For example, the waveguides 56 and 60 may comprise silicon, and the dielectric layer 68 may comprise silicon oxide and/or silicon nitride.

Figure 4:
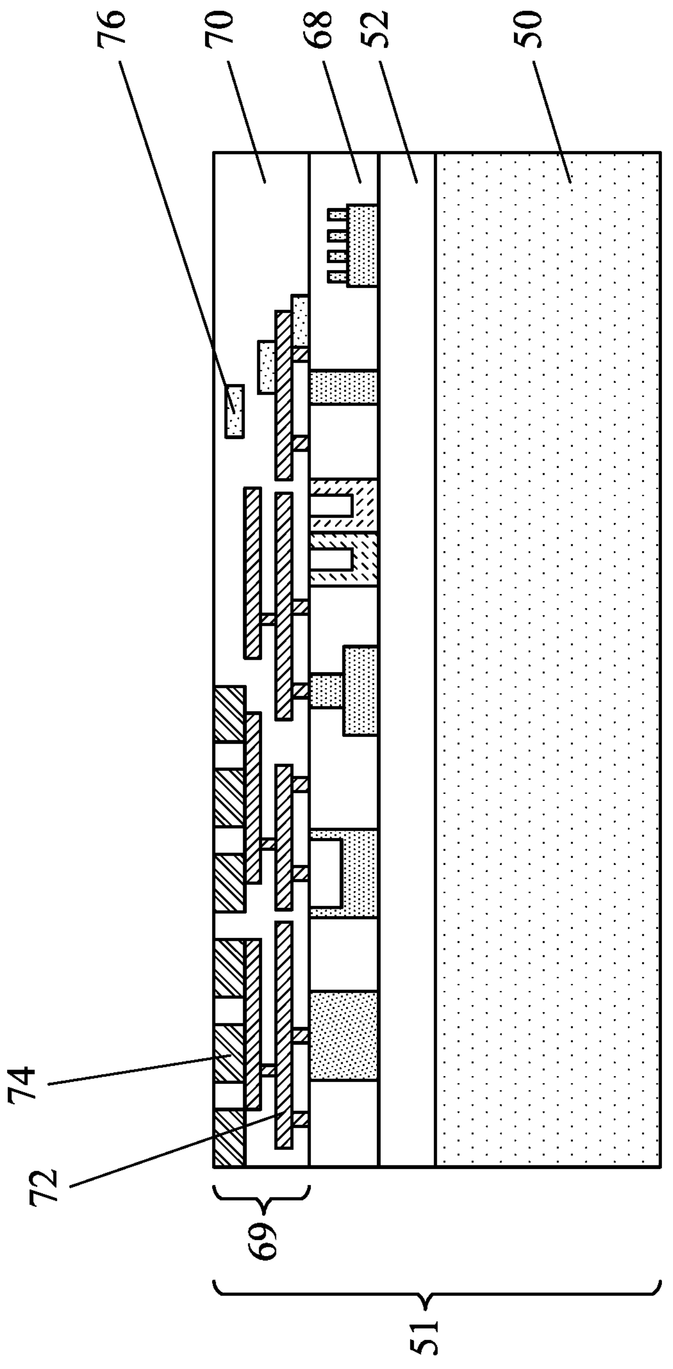

In FIG. 4, a redistribution structure 69 is formed over the dielectric layer 68, in accordance with some embodiments. The redistribution structure 69 includes dielectric layers 70 and conductive features 72 formed in the dielectric layers 70 that provide interconnections and electrical routing. For example, the redistribution structure 69 may connect one or more of the photonic components of the first active layer 63 in the dielectric layer 68 with overlying devices such as electronic die 78 (see FIG. 5). The dielectric layers 70 may be, for example, insulating or passivating layers, and may comprise one or more materials similar to those described above for the dielectric layer 68, such as silicon oxide or silicon nitride, or may comprise a different material. In an embodiment, the redistribution structure 69 may also include second optical components 76 that comprise optical devices such as silicon waveguides, non-silicon waveguides (e.g., silicon nitride waveguides), or the like. In an embodiment, the second optical components 76 may comprise silicon nitride waveguides, wherein silicon nitride waveguides in vertically adjacent (e.g., immediately adjacent) dielectric layers 70 overlap laterally. In addition, one or more of the silicon nitride waveguides laterally overlaps the waveguides 56 and 60 of the first active layer 63. Since optical coupling may happen between waveguides placed in close proximity, by forming the waveguides of the first active layer 63 and the waveguides of the second optical components 76 in such a way that adjacent waveguides are in close vertical proximity, and such that adjacent waveguides of the second optical components 76 overlap laterally in a vertical direction, optical signals can be transmitted (e.g., relayed) in the vertical direction through the optical coupling between adjacent waveguides. The dielectric layers 70 and the dielectric layer 68 may be transparent or nearly transparent to light within the same range of wavelengths. The dielectric layers 70 may be formed using a technique similar to those described above for the dielectric layer 68 or using a different technique. The conductive features 72 may include conductive lines and vias, and may be formed by a damascene process, e.g., single damascene, duel damascene, or the like. As shown in FIG. 4, conductive pads 74 are formed in the topmost layer of the dielectric layers 70. A planarization process (e.g., a CMP process or the like) may be performed after forming the conductive pads 74 such that surfaces of the conductive pads 74 and the topmost dielectric layer 70 are substantially coplanar. The redistribution structure 69 may include more or fewer dielectric layers 70, conductive features 72, or conductive pads 74 than shown in FIG. 4.

Figure 5:
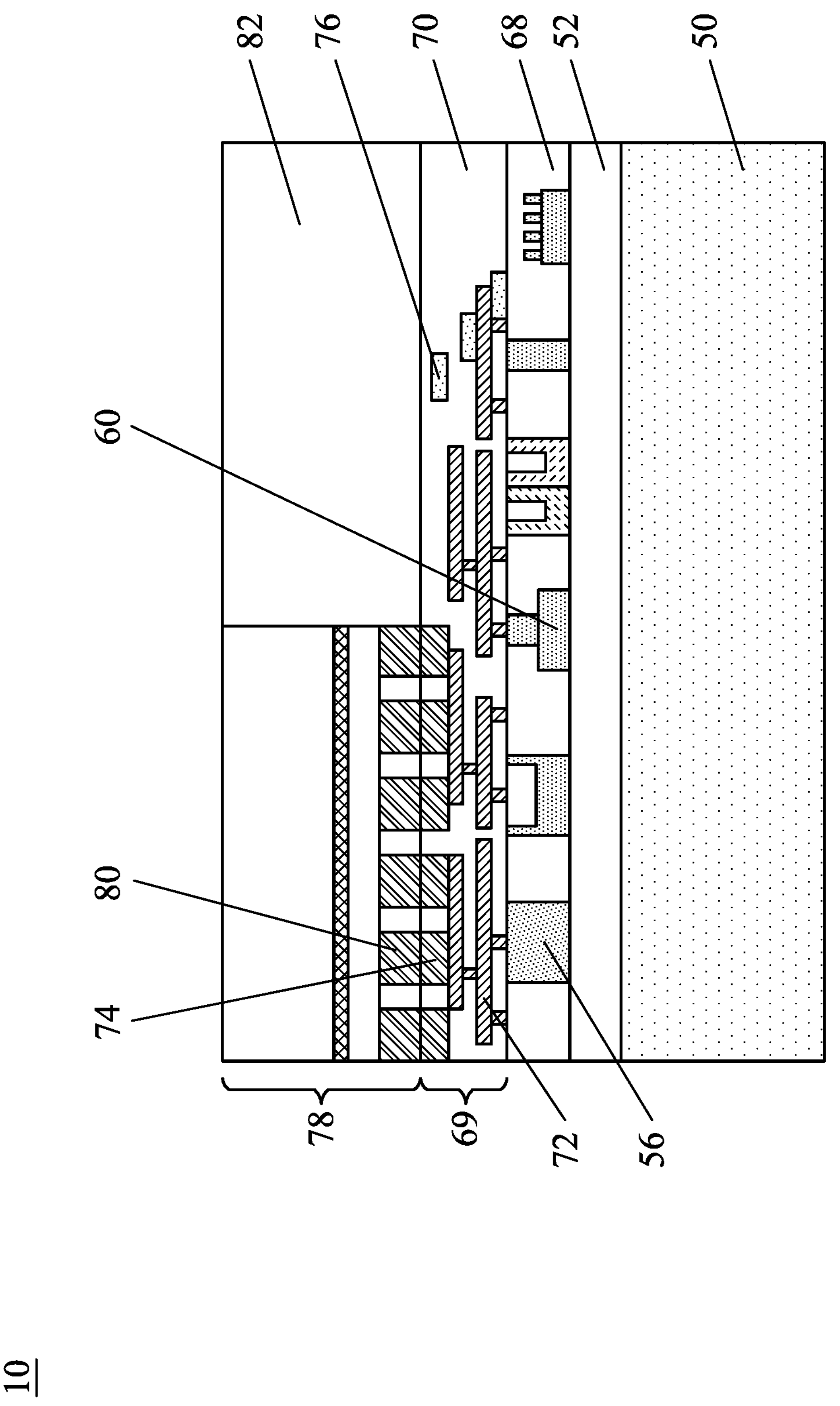

In FIG. 5, one or more electronic dies 78 (also referred to as electronic integrated chips (EICs)) are bonded to the redistribution structure 69, in accordance with some embodiments. The electronic dies 78 may be, for example, semiconductor devices, dies, or chips that communicate with one or more of the photonic components of the first active layer 63 in the dielectric layer 68 using electrical signals. One electronic die 78 is shown in FIG. 5, but two or more electronic dies 78 may be bonded to the redistribution structure 69 in other embodiments. In some cases, multiple electronic dies 78 may be incorporated into the single package component 10 in order to reduce processing cost. The electronic die 78 may include die connectors 80, which may be, for example, conductive pads, conductive pillars, or the like.

The electronic die 78 may include integrated circuits for interfacing with the various photonic components formed in the dielectric layer 68. For example, the electronic die 78 may include controllers, drivers, transimpedance amplifiers, the like, or combinations thereof. The electronic die 78 may also include a CPU, in some embodiments. In some embodiments, the electronic die 78 includes circuits for processing electrical signals received from the photonic components, such as for processing electrical signals received from a photodetector.

In some embodiments, the electronic die 78 is bonded to the redistribution structure 69 by dielectric-to-dielectric bonding and/or metal-to-metal bonding. In such embodiments, covalent bonds may be formed between oxide layers, such as the topmost dielectric layer 70 and surface dielectric layers of the electronic die 78. During the bonding, metal bonding may also occur between the die connectors 80 of the electronic die 78 and the conductive pads 74 of the redistribution structure 69.

In some embodiments, before performing the bonding process, a surface treatment is performed. In some embodiments, the top surfaces of the redistribution structure 69 and/or the electronic die 78 may first be activated utilizing, for example, a dry treatment, a wet treatment, a plasma treatment, exposure to an inert gas, exposure to $H_2$, exposure to $N_2$, exposure to $O_2$, the like, or combinations thereof. However, any suitable activation process may be utilized. After the activation process, the redistribution structure 69 and/or the electronic die 78 may be cleaned using, e.g., a chemical rinse. The electronic die 78 is then aligned with the redistribution structure 69 and placed into physical contact with the redistribution structure 69. The electronic die 78 may be placed on the redistribution structure 69 using a pick-and-place process, for example. An example bonding process includes directly bonding the topmost dielectric layer 70 and surface dielectric layers (not shown) of the electronic die 78 through fusion bonding. In an embodiment, the bond between the topmost dielectric layer 70 and surface dielectric layers (not shown) of the electronic die 78 may be an oxide-to-oxide bond. The bonding process further directly bonds the conductive pads 74 and the die connectors 80 through direct metal-to-metal bonding. Thus, the electronic die 78 and the redistribution structure 69 are electrically connected. This process starts with aligning the conductive pads 74 to the die connectors 80, such that the die connectors 80 overlap with corresponding conductive pads 74. Next, a pre-bonding step is performed, during which the electronic die 78 is put in contact with the redistribution structure 69. The bonding process continues with performing an anneal, for example, at a temperature between about 100° C. and about 450° C. for a duration between about 0.5 hours and about 3 hours, so that the metal in the conductive pads 74 and the die connectors 80 inter-diffuses to each other, and hence the direct metal-to-metal bonding is formed.

After bonding the electronic die 78 to the redistribution structure 69, a dielectric material 82 is formed over the electronic die 78 and the redistribution structure 69, in accordance with some embodiments. The dielectric material 82 may be formed of an oxide film or silicon based material, such as silicon, silicon oxide (SiOx), silicon nitride, the like, or a combination thereof. The dielectric material 82 may be substantially transparent to light at wavelengths suitable for transmitting optical signals or optical power between the coupler 66 and a subsequently formed vertically-mounted optical fiber 228 (see, e.g., FIG. 20). The dielectric material 82 may be formed by CVD, PVD, ALD, a spin-on-dielectric process, the like, or a combination thereof. In some embodiments, the dielectric material 82 may be formed by HDP-CVD, FCVD, the like, or a combination thereof. The dielectric material 82 may be a gap-fill material in some embodiments, which may include one or more of the example materials above. Other dielectric materials formed by any acceptable process may be used. The dielectric material 82 may be planarized using a planarization process such as a CMP process, a grinding process, or the like. In some embodiments, the planarization process may expose the electronic die 78 such that a surface of the electronic die 78 and a surface of the dielectric material 82 are coplanar.

Figure 6:
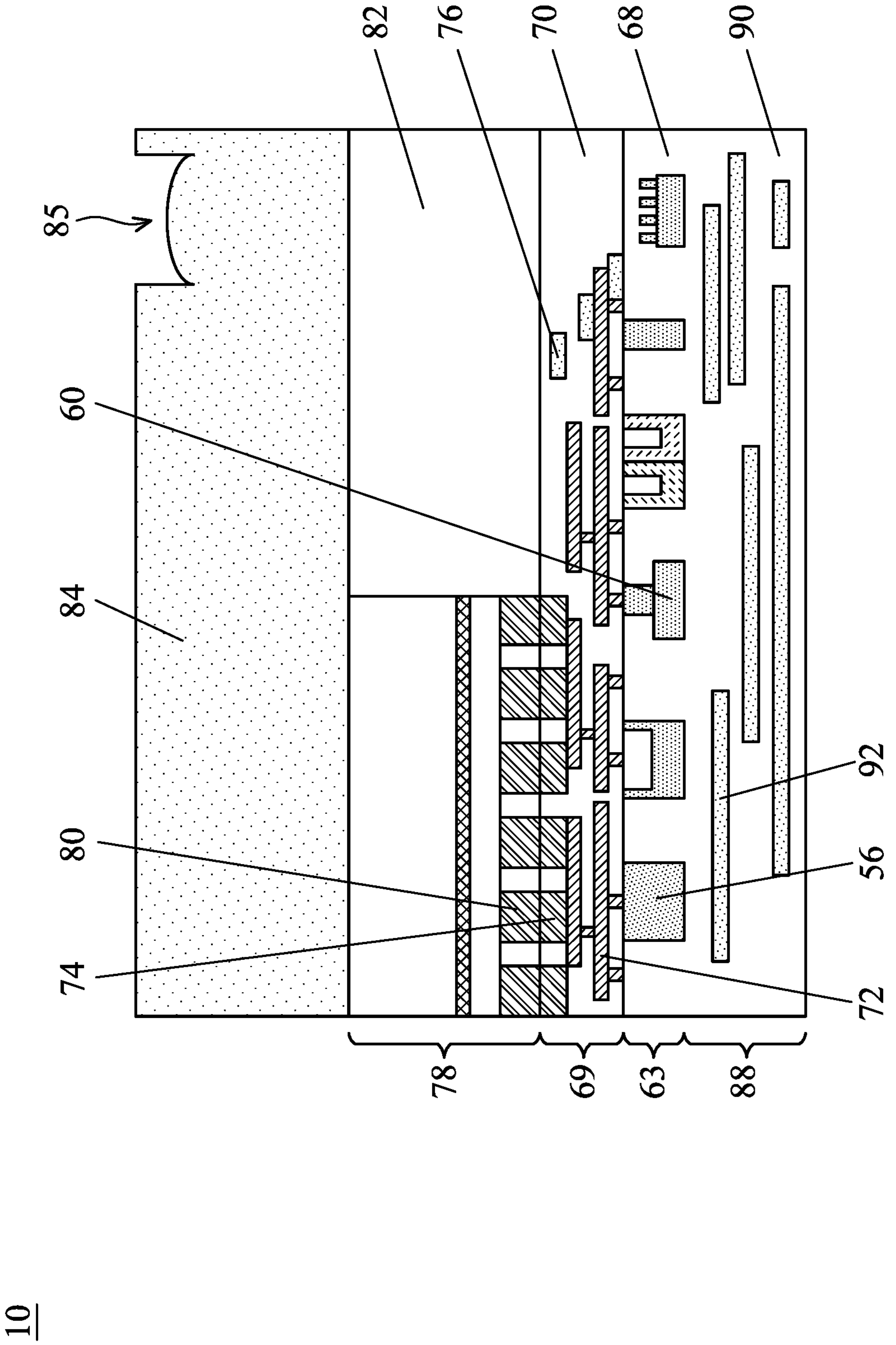

In FIG. 6, a support 84 is attached to the structure shown in FIG. 5, in accordance with some embodiments. The support 84 is a rigid structure that is attached to the structure in order to provide structural or mechanical stability. The use of a support 84 can reduce warping or bending, which can improve the performance of the optical structures such as the waveguides 56 and 60. The support 84 may comprise one or more materials such as silicon (e.g., a silicon wafer, bulk silicon, or the like), a silicon oxide, the like, or another type of material. The support 84 may be attached to the structure (e.g., to surfaces of the dielectric material 82 and/or the electronic die 78) using an adhesive layer (not shown in FIG. 6), or the support 84 may be attached using direct bonding or another suitable technique. The support 84 may also have lateral dimensions (e.g., length, width, and/or area) that are greater than, about the same as, or smaller than those of the structure. In other embodiments, the support 84 is attached at a later process step during the manufacturing the package component 10 than shown.

Further referring to FIG. 6, an etching process is performed to remove a portion of the support 84 to form a recess of a micro lens 85. A bottom surface of the recess in the support 84 may be curved to form the micro lens 85.

After the formation of the micro lens 85, the substrate 50 and the insulator layer 52 are removed, in accordance with some embodiments. The substrate 50 and the insulator layer 52 may be removed using a planarization process (e.g., a CMP or grinding process), an etching process, a combination thereof, or the like. After the removal of the substrate 50 and the insulator layer 52, surfaces of the dielectric layer 68, the waveguides 56 and 60, the germanium modulator 58, the P—N modulator 62, the coupler 66, and other photonic components formed in the dielectric layer 68 are exposed. A first structure 88 is then formed over the exposed surfaces of the dielectric layer 68, the waveguides 56 and 60, the germanium modulator 58, the P—N modulator 62, the coupler 66, in accordance with some embodiments. The first structure 88 comprises a plurality of dielectric layers 90 and third optical components 92 (e.g., silicon nitride waveguides) embedded in the plurality of dielectric layers 90. The plurality of dielectric layers 90 may comprise one or more materials such as silicon oxide, spin-on glass, or the like, using CVD, PVD, spin-on, or the like, though another technique may be used. To form the third optical components 92, a plurality of silicon nitride layers are deposited, with each silicon nitride layer being deposited using a suitable technique such as CVD, PECVD, LPCVD, PVD, or the like. Each of the silicon nitride layers are then individually patterned using acceptable photolithography and etching techniques. In an embodiment, the third optical components 92 may also comprise other photonic components such as modulators, couplers, photodetectors, splitters, or the like.

The third optical components 92 may be individual separate optical components or connected as a single continuous structure. In some embodiments, one or more of the third optical components 92 form a continuous loop. In an embodiment, the third optical components 92 may comprise silicon nitride waveguides, wherein silicon nitride waveguides in the different dielectric layers 90 (e.g., dielectric layers that are in close vertical proximity) overlap laterally. In addition, one or more of the silicon nitride waveguides is in close vertical proximity and is laterally overlapped by the waveguides 56 and 60 of the first active layer 63. Since optical coupling may happen between waveguides placed in close proximity, by forming the waveguides of the first active layer 63 and the waveguides of the third optical components 92 in such a way that these waveguides are in close vertical proximity, and such that they overlap laterally in a vertical direction, optical signals can be transmitted (e.g., relayed) in the vertical direction through the optical coupling between adjacent waveguides.

Optical signals may also be transmitted between the second optical components 76 and the third optical components 92 through the waveguides 56 and 60 of the first active layer 63. The third optical components 92 may comprise any number of optical components and the plurality of dielectric layers 90 may comprise any number of dielectric layers 90.

Figure 7:
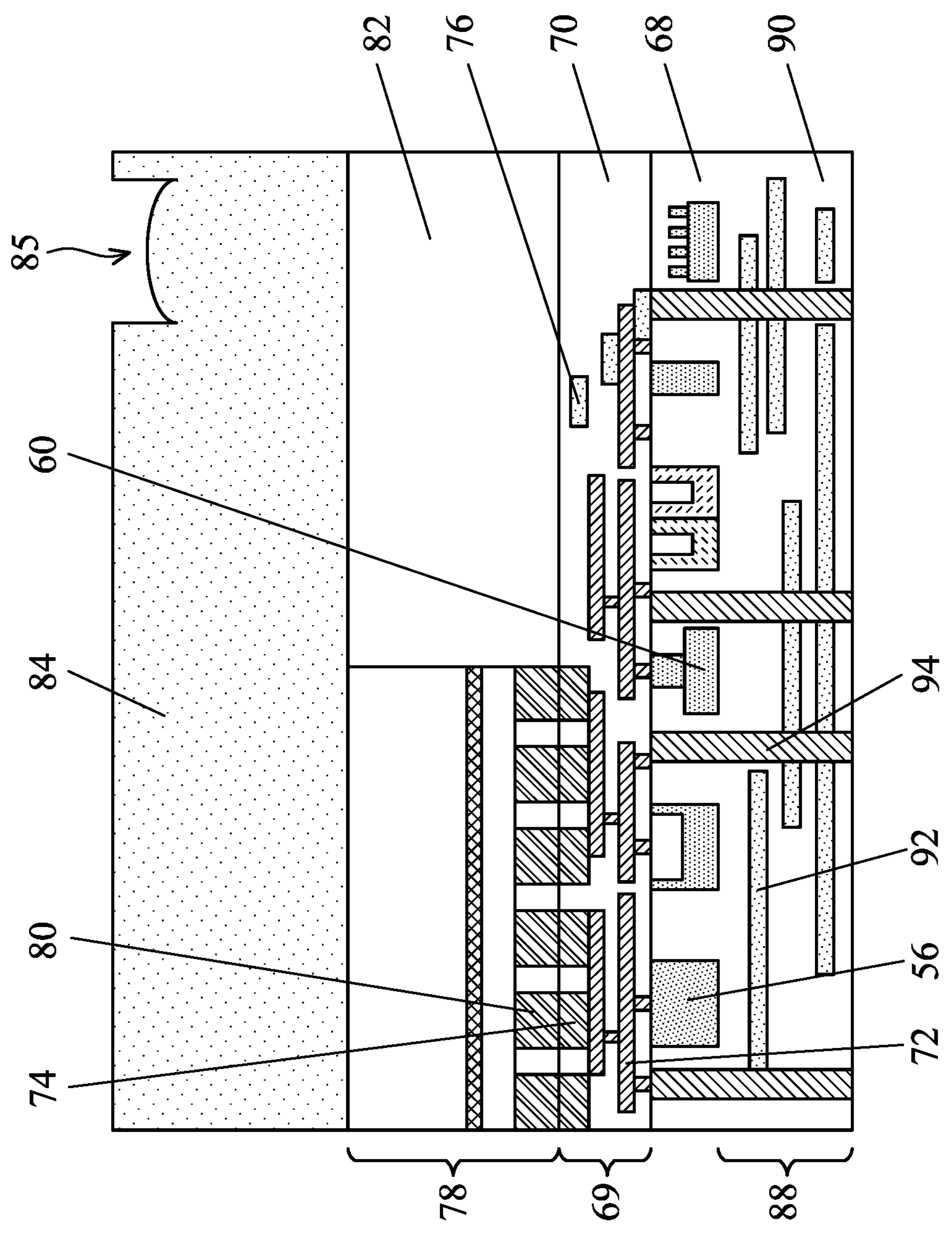

In FIG. 7, vias 94 are formed in the first structure 88, in accordance with some embodiments. In some embodiments, the vias 94 are formed by a damascene process, e.g., single damascene, dual damascene, or the like. The vias 94 may be formed, for example, by forming openings extending through the first structure 88 and the dielectric layer 68. The openings may be formed using acceptable photolithography and etching techniques, such as by forming and patterning a photoresist and then performing an etching process using the patterned photoresist as an etching mask. The etching process may include, for example, a dry etching process and/or a wet etching process. The openings may expose portions of the conductive features 72 of the redistribution structure 69.

A conductive material may then be formed in the openings, thereby forming vias 94, in accordance with some embodiments. In some embodiments, a liner (not shown), such as a diffusion barrier layer, an adhesion layer, or the like, may be formed in the openings from TaN, Ta, TiN, Ti, CoW, or the like, and may be formed using suitable a deposition process such as ALD or the like. In some embodiments, a seed layer (not shown), which may include copper or a copper alloy may then be deposited in the openings. The conductive material of the vias 94 may be formed in the openings using, for example, a plating process. The conductive material may include, for example, a metal or a metal alloy such as copper, silver, gold, tungsten, cobalt, aluminum, or alloys thereof. A planarization process (e.g., a CMP process or a grinding process) may be performed to remove excess conductive material along the top surface of the first structure 88, such that top surfaces of the vias 94 and the first structure 88 (e.g., a top surface of the dielectric layers 90) are level. The vias 94 may be formed using other techniques or materials in other embodiments.

Figure 8:
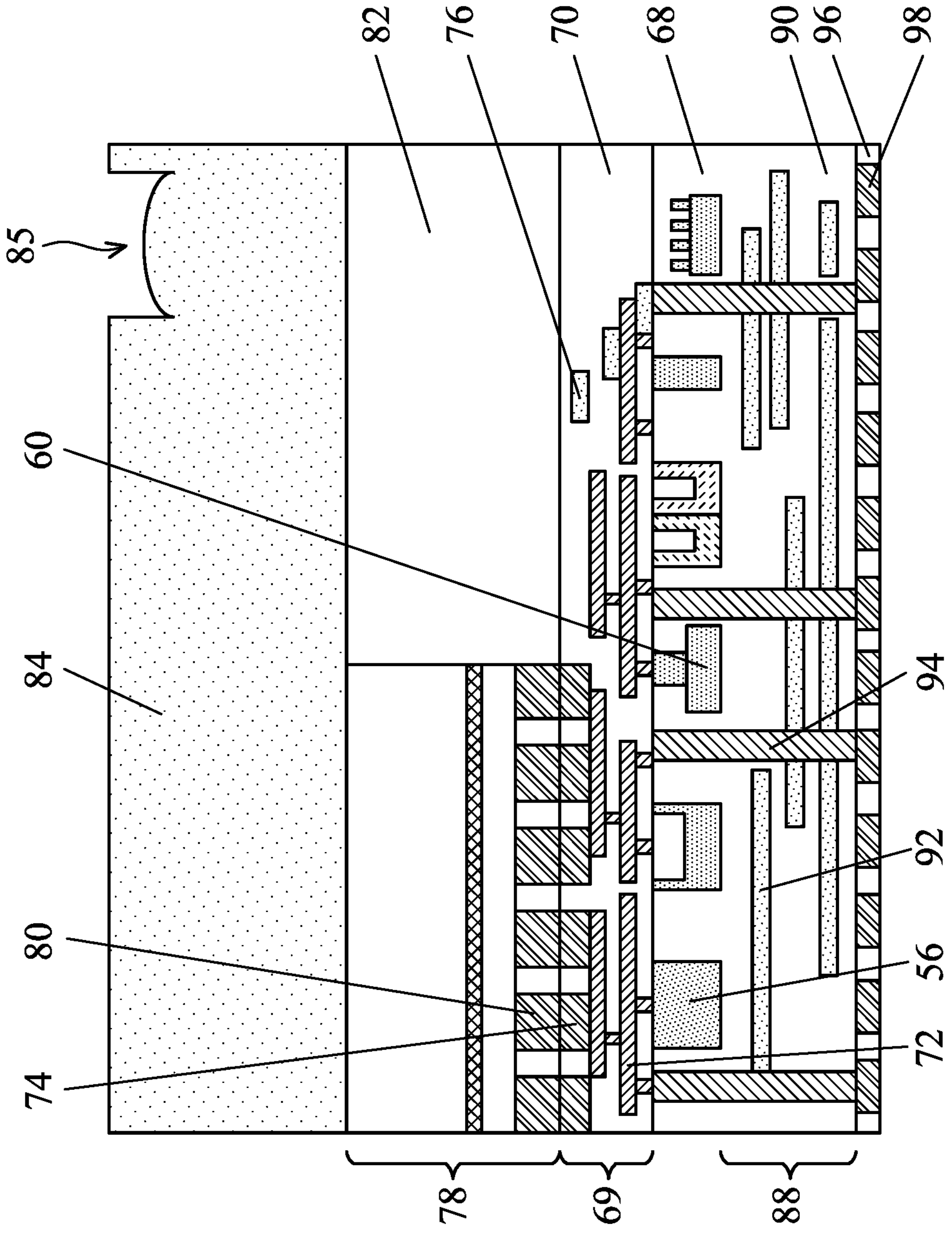

In FIG. 8, conductive connectors 98 (also referred to as bond pads subsequently) are formed over and in physical contact with the first structure 88. For example, the conductive connectors 98 may be electrically connected to the electronic die 78 through the vias 94 and the redistribution structure 69. The conductive connectors may be formed by first forming a seed layer over the first structure 88, such as over the vias 94 and the plurality of dielectric layers 90. The seed layer may comprise a copper layer, and may be deposited using processes such as sputtering, evaporation, or plasma-enhanced chemical vapor deposition (PECVD), or the like, depending upon the desired materials. A mask layer (e.g., a photoresist) is then formed over the seed layer and patterned to form openings in the mask layer that expose portions of the seed layer in the openings. A plate metal may be deposited in the openings of the mask layer over the exposed seed layer through a plating process such as electrical or electro-less plating. The plate metal may comprise copper, a copper alloy, aluminum, or the like. The mask layer may then be removed by a suitable removal process, such as ashing or etching. Once the mask layer is removed, exposed portions of the seed layer are removed, such as by using an acceptable etching process, such as by wet or dry etching. The remaining portions of the seed layer and plate metal form the conductive connectors 98. The conductive connectors 98 may be conductive pillars, pads, or the like, to which external connections are made.

A dielectric layer 96 is then formed over the conductive connectors 98 to encapsulate the conductive connectors 98. The dielectric layer 96 may be an oxide, a nitride, a carbide, a polymer, the like, or a combination thereof. The dielectric layer 96 may be formed, for example, by spin coating, lamination, chemical vapor deposition (CVD), or the like. Initially, the dielectric layer 96 may bury the conductive connectors 98, such that a top surface of the dielectric layer 96 is above top surfaces of the conductive connectors 98. The conductive connectors 98 may be exposed through the dielectric layer 96 by a removal process that can be applied to the various layers to remove excess materials over the conductive connectors 98. The removal process may be a planarization process such as a chemical mechanical polish (CMP), an etch-back, combinations thereof, or the like. After the planarization process, top surfaces of the conductive connectors 98 and the dielectric layer 96 are coplanar (within process variations).

In alternate embodiments, the conductive connectors 98 may be formed by a damascene process, or the like. The conductive connectors 98 may be formed, for example, by first forming the dielectric layer 96 over and in physical contact with the first structure 88 and the vias 94. Openings are then formed that extend through the dielectric layer 96 and expose the vias 94. The openings may be formed using acceptable photolithography and etching techniques, such as by forming and patterning a photoresist and then performing an etching process using the patterned photoresist as an etching mask. The etching process may include, for example, a dry etching process and/or a wet etching process. A conductive material (e.g., copper, a copper alloy, gold, aluminum, or the like) may then be formed in the openings, thereby forming the conductive connectors 98, in accordance with some embodiments. A planarization process (e.g., a CMP process or a grinding process) may be performed to remove excess conductive material along the top surface of the dielectric layer 96, such that top surfaces of the conductive connectors 98 and the dielectric layer 96 are level.

Figure 9:
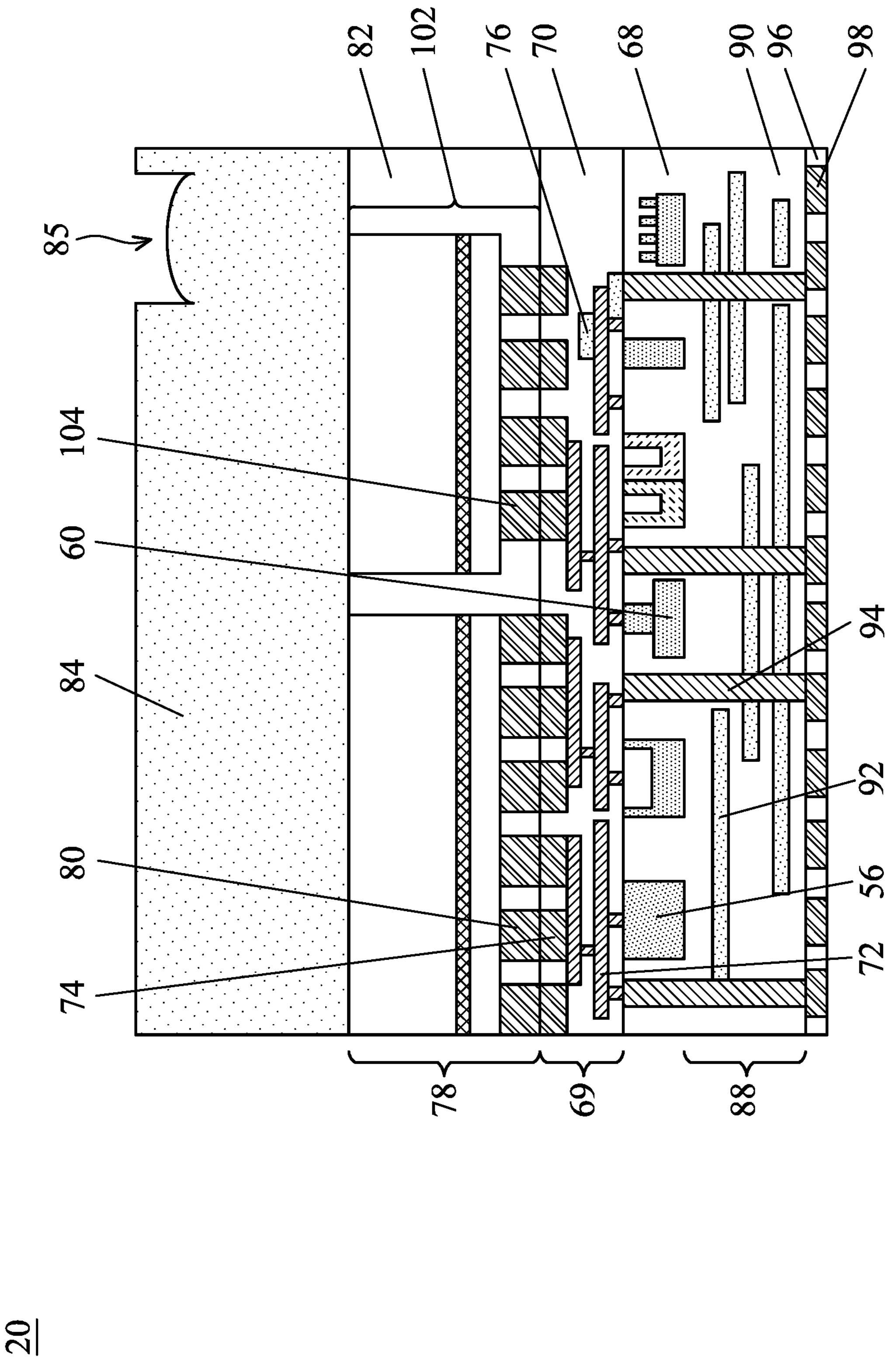
FIG. 9 illustrates a cross-sectional view of a photonic package, in accordance with another embodiment.

FIG. 9 illustrates a package component 20 which may be similar to the package component 10 of FIGS. 1 through 8 where like reference numerals indicate like elements formed using like processes, unless specified otherwise. Accordingly, the process steps and applicable materials may not be repeated herein. The package component 10 differs from the package component 20 in that the package component 20 comprises a photonic component 102. The photonic component 102 is bonded to the redistribution structure 69 in a similar manner and using similar processes as described above in FIG. 5 for the bonding of the electronic die 78 to the redistribution structure 69. For example, the photonic component 102 is bonded to the redistribution structure 69 by dielectric-to-dielectric bonding and/or metal-to-metal bonding. In such embodiments, covalent bonds may be formed between oxide layers, such as the topmost dielectric layer 70 and surface dielectric layers (not shown) of the photonic component 102. During the bonding, metal bonding may also occur between the die connectors 104 of the photonic component 102 and the conductive pads 74 of the redistribution structure 69.

In accordance with some embodiments, photonic component 102 is or comprises a photo diode (such as a laser diode), which may be formed of or comprise a III-V semiconductor material. In accordance with some embodiments, photonic component 102 is configured to receive an electrical signal, and emit a light beam (such as a laser beam) to one or more couplers of the first optical components 39, the second optical components 76 or the third optical components 92. In this way, the photonic component 102 is utilized to generate light in order to power the first optical components 39, the second optical components 76 and/or the third optical components 92. The photonic component 102 may be disposed between and in physical contact with the redistribution structure 69 and the support 84. In addition the photonic component may be laterally encapsulated by the dielectric material 82.

Figure 10:
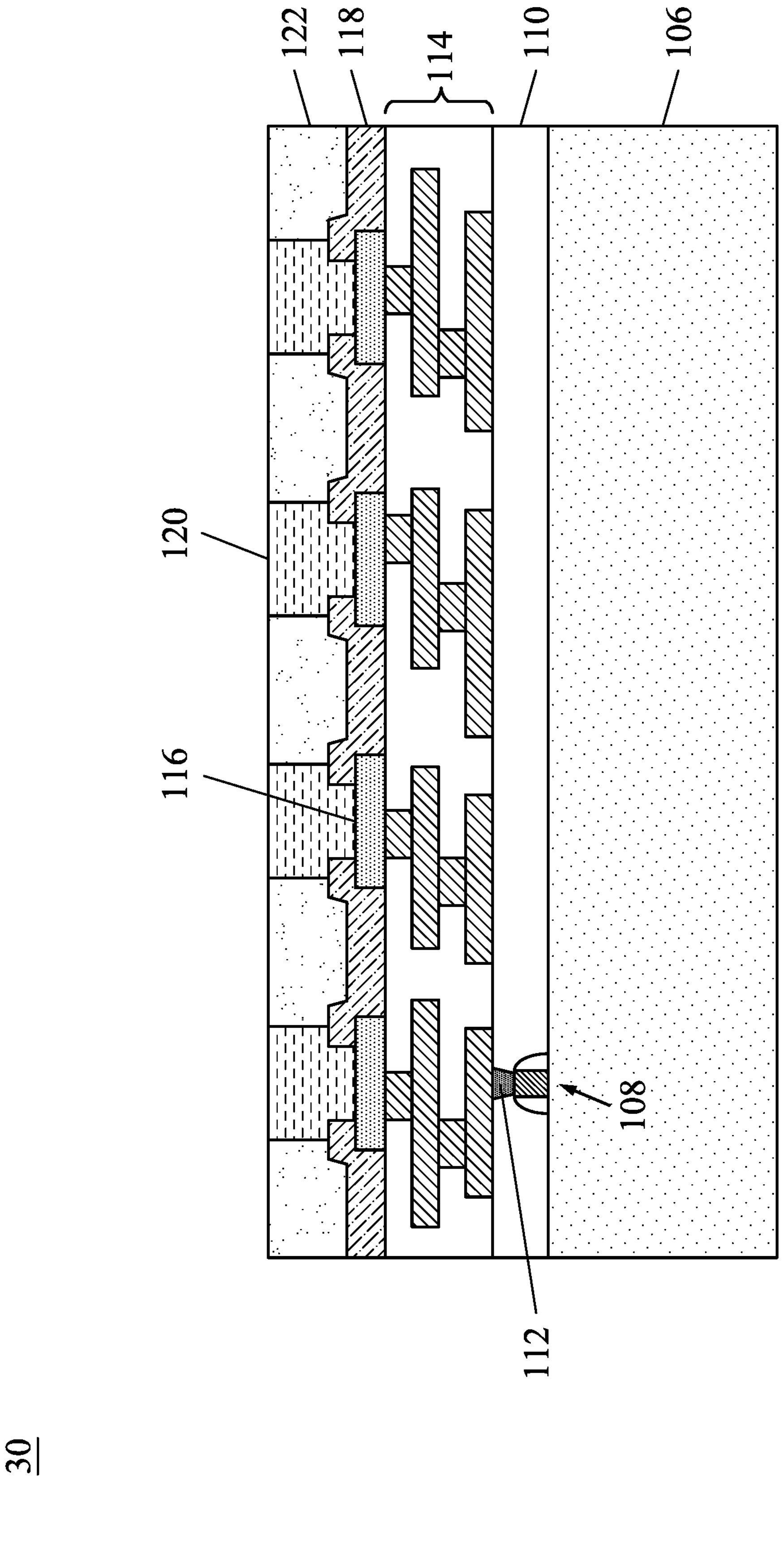
FIG. 10 illustrates a cross-sectional view of an integrated circuit die, in accordance with an embodiment.

FIG. 10 illustrates a detailed view of a package component 30 when the package component 30 is a semiconductor die. In some embodiments, the package component 30 comprises an application-specific integrated circuit (ASIC), processing die, a central processing unit (CPU), a graphics processing unit (GPU), a high performance computing (HPC) die, the like, or a combination thereof. The package component 30 may be formed in a wafer, which may include different device regions that are singulated in subsequent steps to form a plurality of integrated circuit dies. The package component 30 may be processed according to applicable manufacturing processes to form integrated circuits. The package component 30 may be further processed according to applicable manufacturing processes to form one or more optical components within the package component 30. The package component 30 includes a semiconductor substrate 106, such as silicon, doped or undoped, or an active layer of a semiconductor-on-insulator (SOI) substrate. The semiconductor substrate 106 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 106 has an active surface (e.g., the surface facing upwards in FIG. 10), sometimes called a front side, and an inactive surface (e.g., the surface facing downwards in FIG. 10), sometimes called a back side.

Devices (represented by a transistor) 108 may be formed at the front surface of the semiconductor substrate 106. The devices 108 may be active devices (e.g., transistors, diodes, etc.), capacitors, resistors, etc. An inter-layer dielectric (ILD) 110 is over the front surface of the semiconductor substrate 106. The ILD 110 surrounds and may cover the devices 108. The ILD 110 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like.

Conductive plugs 112 extend through the ILD 110 to electrically and physically couple the devices 108. For example, when the devices 108 are transistors, the conductive plugs 112 may couple the gates and source/drain regions of the transistors. Source/drain region(s) may refer to a source or a drain, individually or collectively dependent upon the context. The conductive plugs 112 may be formed of tungsten, cobalt, nickel, copper, silver, gold, aluminum, the like, or combinations thereof. An interconnect structure 114 is over the ILD 110 and conductive plugs 112. The interconnect structure 114 interconnects the devices 108 to form an integrated circuit. The interconnect structure 114 may be formed by, for example, metallization patterns in dielectric layers on the ILD 110. The metallization patterns include metal lines and vias formed in one or more low-k dielectric layers. The metallization patterns of the interconnect structure 114 are electrically coupled to the devices 108 by the conductive plugs 112.

The package component 30 further includes pads 116, such as aluminum pads, to which external connections are made. The pads 116 are on the active side of the package component 30, such as in and/or on the interconnect structure 114. One or more passivation films 118 are on the package component 30, such as on portions of the interconnect structure 114 and pads 116. Openings extend through the passivation films 118 to the pads 116. Die connectors 120, such as conductive pillars (for example, formed of a metal such as copper), extend through the openings in the passivation films 118 and are physically and electrically coupled to respective ones of the pads 116. The die connectors 120 may be formed by, for example, plating, or the like. The die connectors 120 electrically couple the respective integrated circuits of the package component 30.

A dielectric layer 122 may (or may not) be on the active side of the package component 30, such as on the passivation films 118 and the die connectors 120. The dielectric layer 122 laterally encapsulates the die connectors 120, and the dielectric layer 122 is laterally coterminous with the package component 30. Initially, the dielectric layer 122 may bury the die connectors 120, such that the topmost surface of the dielectric layer 122 is above the topmost surfaces of the die connectors 120.

The dielectric layer 122 may be a polymer such as PBO, polyimide, BCB, or the like; a nitride such as silicon nitride or the like; an oxide such as silicon oxide, PSG, BSG, BPSG, the like, or a combination thereof. The dielectric layer 122 may be formed, for example, by spin coating, lamination, chemical vapor deposition (CVD), or the like. In some embodiments, the die connectors 120 are exposed through the dielectric layer 122 during formation of the package component 30. In some embodiments, the die connectors 120 remain buried and are exposed during a subsequent process for packaging the package component 30.

Figure 11:
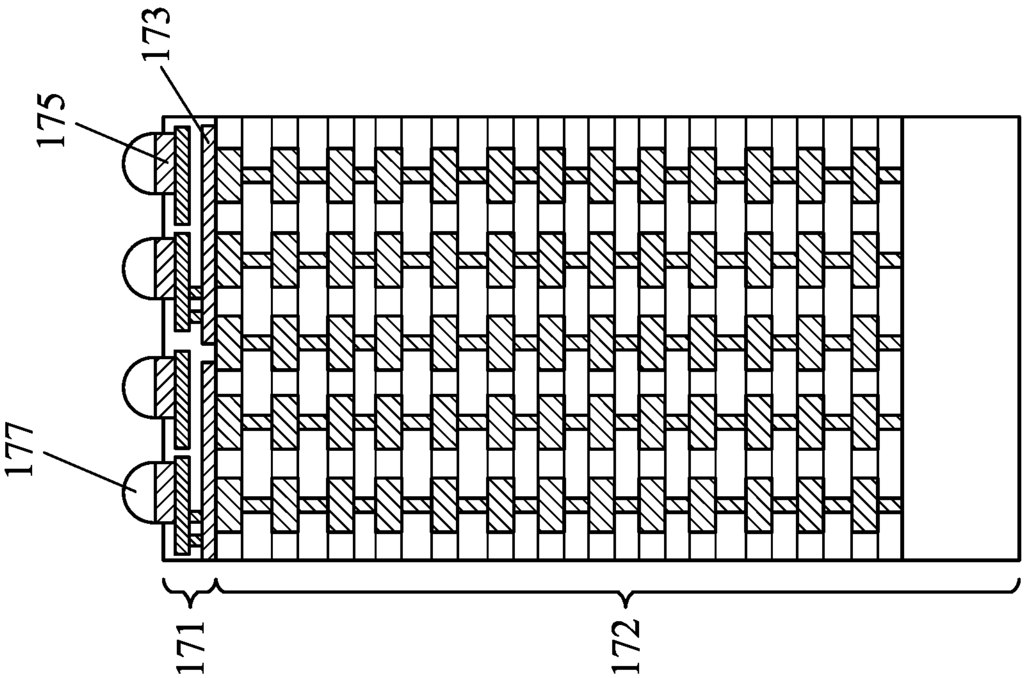
FIG. 11 illustrates a cross-sectional view of a memory device, in accordance with an embodiment.

FIG. 11 illustrates a package component 40 which may comprise, e.g., a memory die, a high-bandwidth memory (HBM) device, a volatile memory such as dynamic random-access memory (DRAM), static random-access memory (SRAM), another type of memory, or the like. FIG. 11 shows a substrate 172 of the package component 40. The substrate 172 may include memory dies in the form of a die stack.

The package component 40 may further include an interconnect structure 171 over and electrically connected to the substrate 172. The interconnect structure 171 may comprise conductive pads 173 that are electrically connected to the memory dies of the substrate 172. The interconnect structure 171 may also include one or more dielectric layer(s) and respective metallization pattern(s) in the dielectric layer(s). The metallization patterns may comprise vias and/or traces to interconnect the package component 40 to an external device. The metallization patterns are sometimes referred to as Redistribution Lines (RDL). The dielectric layers may comprise silicon oxide, silicon nitride, silicon carbide, silicon oxynitride, low-K dielectric material, such as PSG, BPSG, FSG, SiOxCy, Spin-On-Glass, Spin-On-Polymers, silicon carbon material, compounds thereof, composites thereof, combinations thereof, or the like. The metallization patterns may comprise copper, aluminum, tungsten, silver, and combinations thereof, or the like.

Referring further to FIG. 11, the interconnect structure 171 also comprises conductive pads 175 at a top surface of the interconnect structure 171. The conductive pads 175 are disposed in openings of the dielectric layers of the interconnect structure 171. The conductive pads 175 are in physical and electrical contact with a topmost metallization pattern of the interconnect structure 171. In some embodiments, the conductive pads 175 include under bump metallurgies (UBMs). The conductive pads 175 comprise a metal, like copper, titanium, tungsten, aluminum, or the like. Conductive connectors 177 are also disposed on the conductive pads 175. The conductive connectors 177 are electrically coupled to the interconnect structure 171. The conductive connectors 177 may comprise micro bumps, solder balls, or the like. The conductive connectors 177 may comprise a conductive material such as solder, copper, aluminum, gold, nickel, silver, palladium, tin, the like, or a combination thereof. In another embodiment, the conductive connectors 177 comprise metal pillars (such as a copper pillar) formed by electro plating, electroless plating, CVD, sputtering, printing, or the like. The metal pillars may be solder free and have substantially vertical sidewalls. In some embodiments, a metal cap layer may be disposed on the top of the metal pillars. The metal cap layer may comprise nickel, tin, tin-lead, gold, silver, palladium, indium, nickel-palladium-gold, nickel-gold, the like, or a combination thereof.

Figure 12:
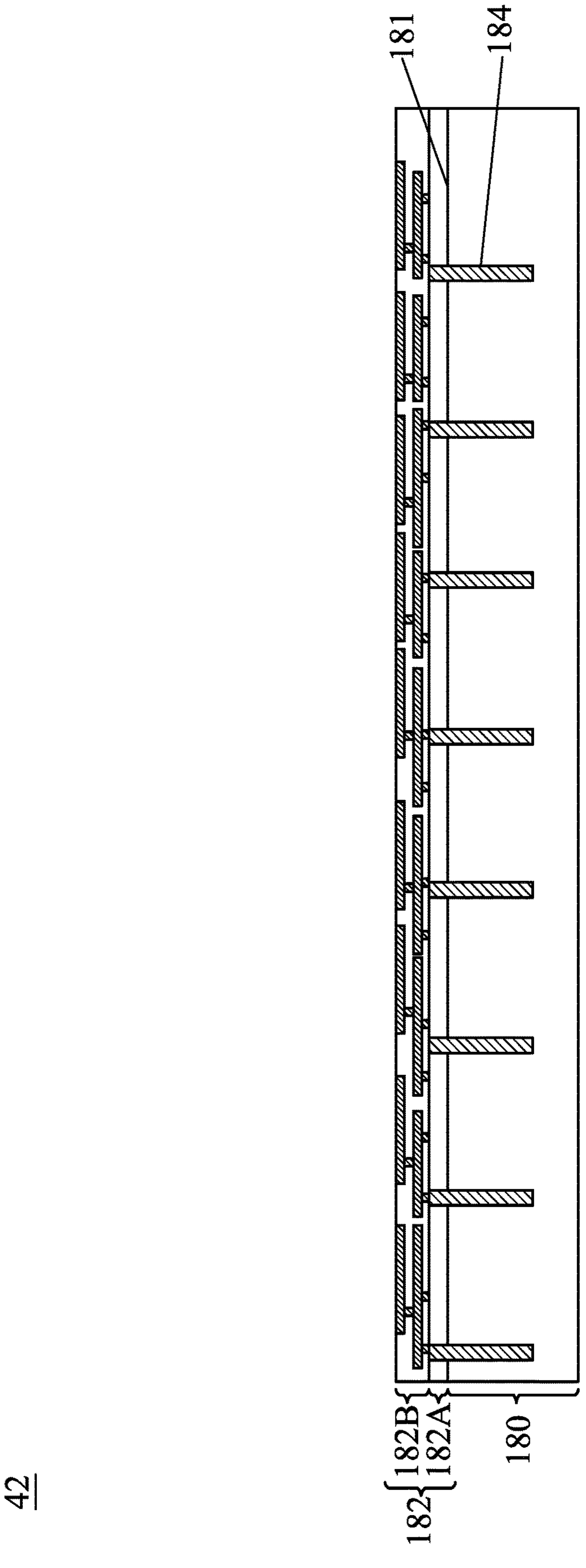
FIGS. 12 through 14 illustrate cross-sectional views of a first interposer at various stages of manufacturing, in accordance with an embodiment.
Figure 13:
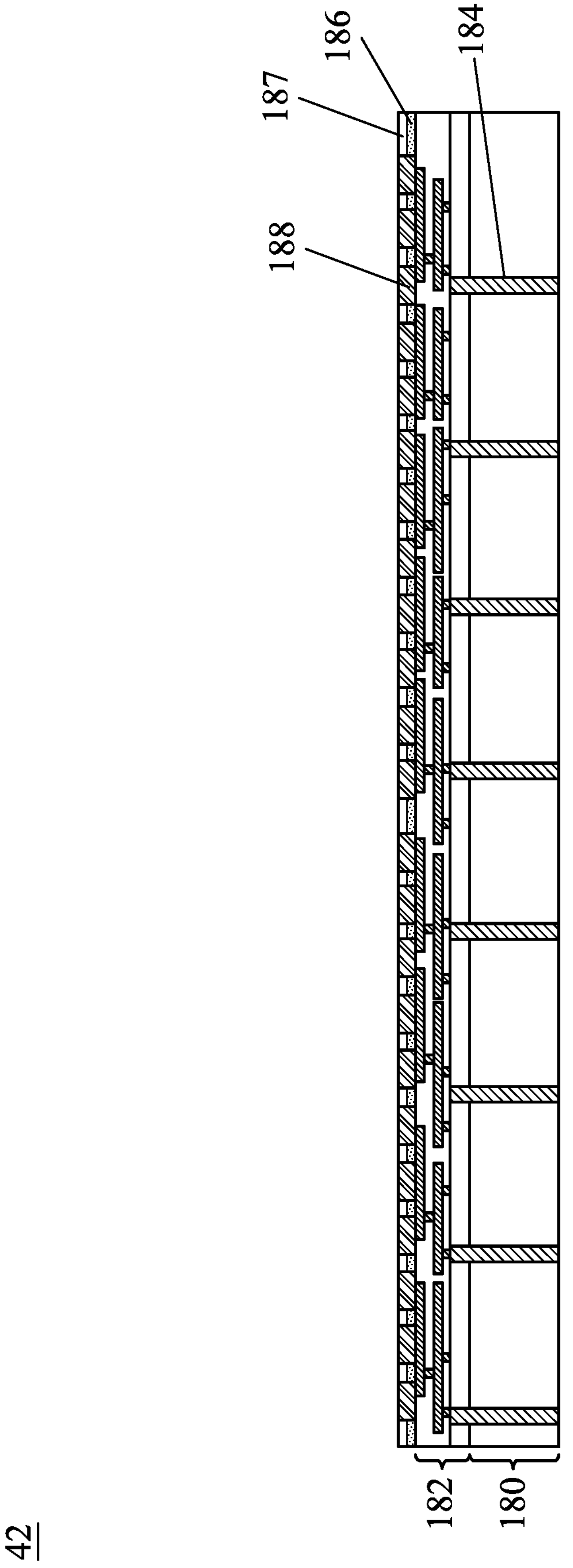
Figure 14:
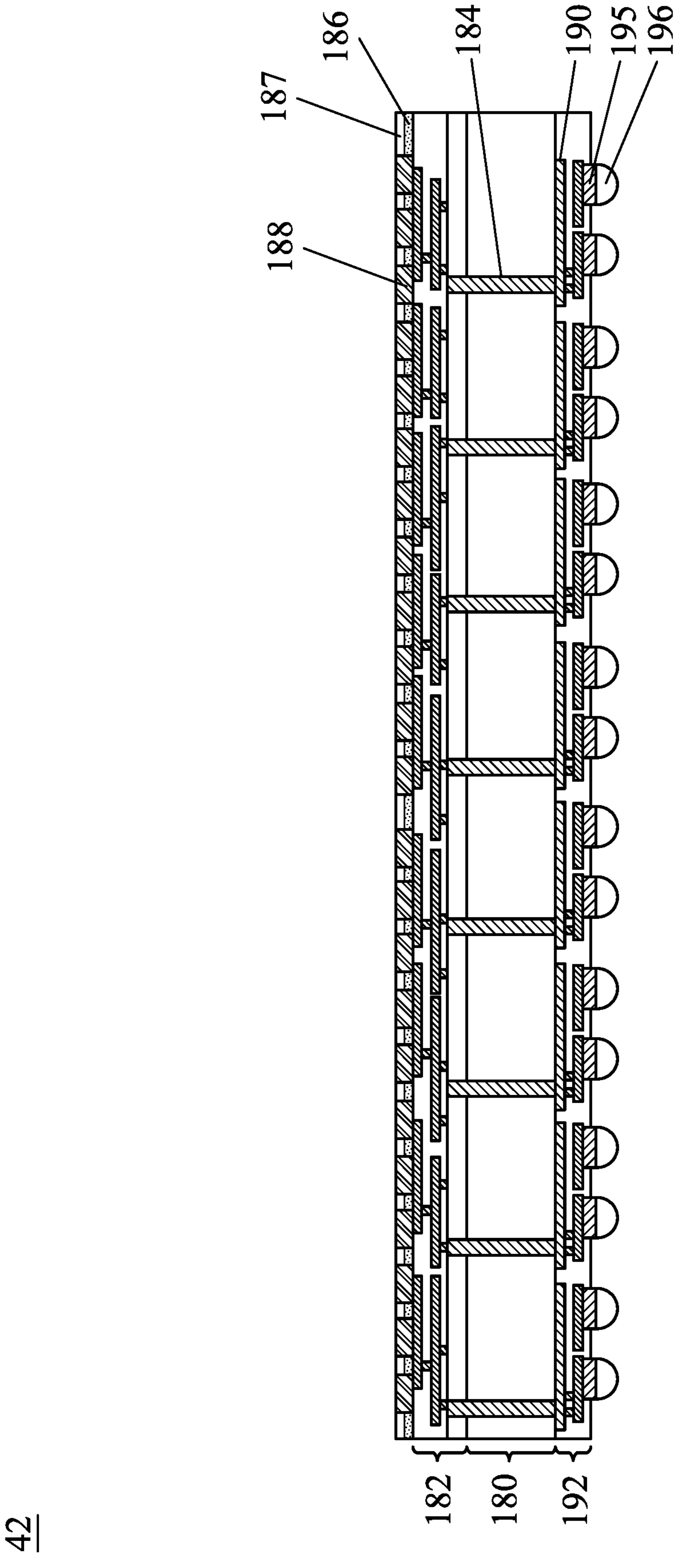

FIGS. 12 to 14 illustrate cross-sectional views of a first interposer 42 at various stages of manufacturing, in accordance with an embodiment. The first interposer 42 comprises a substrate 180, in accordance with some embodiments. The substrate 180 can be a wafer. The substrate 180 may comprise a bulk semiconductor substrate, SOI substrate, multi-layered semiconductor substrate, or the like. The semiconductor material of the substrate 180 may be silicon, germanium, a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The substrate 180 may be doped or undoped. The substrate 180 will generally not include active devices therein, although it may include active and passive devices formed in and/or on a first surface 181 on a first side of the substrate 180.

A first portion 182A of a first metallization layer 182 is formed over the first surface 181 of the substrate 180. The first portion 182A of the first metallization layer 182 may include one or more dielectric layer(s) and respective metallization pattern(s) in the dielectric layer(s). The metallization patterns may comprise vias and/or traces to interconnect subsequently formed TVs 184 together and/or to an external device. The dielectric layers may comprise silicon oxide, silicon nitride, silicon carbide, silicon oxynitride, low-K dielectric material, such as PSG, BPSG, FSG, SiOxCy, Spin-On-Glass, Spin-On-Polymers, silicon carbon material, compounds thereof, composites thereof, combinations thereof, or the like. The dielectric layers may be deposited by any suitable method known in the art, such as spinning, CVD, PECVD, HDP-CVD, or the like. A metallization pattern may be formed in the dielectric layer, for example, by using photolithography techniques to deposit and pattern a photoresist material on the dielectric layer to expose portions of the dielectric layer that are to become the metallization pattern. An etch process, such as an anisotropic dry etch process, may be used to create recesses and/or openings in the dielectric layer corresponding to the exposed portions of the dielectric layer. The recesses and/or openings may be lined with a diffusion barrier layer and filled with a conductive material. The diffusion barrier layer may comprise one or more layers of TaN, Ta, TiN, Ti, CoW, or the like, deposited by ALD, or the like, and the conductive material may comprise copper, aluminum, tungsten, silver, and combinations thereof, or the like, deposited by CVD, PVC, or the like. Any excessive diffusion barrier layer and/or conductive material on the dielectric layer may be removed, such as by using a CMP.

Through-vias (TVs) 184 are formed to extend through the substrate 180 and through the first portion 182A of the first metallization layer 182 The TVs 184 may be formed by forming recesses in the substrate 180 and the first portion 182A of the first metallization layer 182 by, for example, etching, milling, laser techniques, a combination thereof, and/or the like. A thin dielectric material may be formed in the recesses, such as by using an oxidation technique. A thin barrier layer may be conformally deposited over the front side of the substrate 180 and in the openings, such as by CVD, ALD, PVD, thermal oxidation, a combination thereof, and/or the like. The barrier layer may comprise a nitride or an oxynitride, such as titanium nitride, titanium oxynitride, tantalum nitride, tantalum oxynitride, tungsten nitride, a combination thereof, and/or the like. A conductive material may be deposited over the thin barrier layer and in the openings. The conductive material may be formed by an electro-chemical plating process, CVD, ALD, PVD, a combination thereof, and/or the like. Examples of conductive materials are copper, tungsten, aluminum, silver, gold, a combination thereof, and/or the like. Excess conductive material and barrier layer is removed by, for example, CMP. Thus, the TVs 184 may comprise a conductive material and a thin barrier layer between the conductive material and the substrate 180. After the formation of the TVs 184, a second portion 182B of the first metallization layer 182 is formed over the first portion 182A of the first metallization layer 182 and the TVs 184. The second portion 182B of the first metallization layer 182 is formed using similar processes and similar materials as the first portion 182A of the first metallization layer 182.

In FIG. 13, conductive connectors 188 (also referred to as bond pads subsequently) and fourth optical components 186 are formed over and in physical contact with the first metallization layer 182. To form the fourth optical components 186, a core material is formed over the first metallization layer 182. The core material may comprise silicon nitride and may be deposited using a suitable technique such as CVD, PECVD, LPCVD, PVD, or the like. The core material is then patterned using acceptable photolithography and etching techniques to form the fourth optical components 186. The fourth optical components 186 may comprise one or more silicon nitride waveguides, splitters, couplers, modulators, or the like. A dielectric layer 187 is then formed over the fourth optical components 186. A material of the fourth optical components 186 and a material of the dielectric layer 187 may be different. The dielectric layer 187 may be an oxide (e.g., silicon oxide), or the like. In some embodiments, the refractive index of the dielectric layer 187 is smaller than the refractive index of the fourth optical components 186 (e.g. the patterned waveguide) to ensure that the fourth optical components 186 have high internal reflections such that light is substantially confined within the fourth optical components 186. The dielectric layer 187 may be formed, for example, by spin coating, lamination, chemical vapor deposition (CVD), or the like.

Conductive connectors 188 may then be formed by a damascene process, or the like. The conductive connectors 188 may be formed, for example, by first forming openings that extend through the dielectric layer 187 and the fourth optical components 186. The openings may be formed using acceptable photolithography and etching techniques, such as by forming and patterning a photoresist and then performing an etching process using the patterned photoresist as an etching mask. The etching process may include, for example, a dry etching process and/or a wet etching process. A conductive material (e.g., copper, a copper alloy, gold, aluminum, or the like) may then be formed in the openings, thereby forming the conductive connectors 188, in accordance with some embodiments. A planarization process (e.g., a CMP process or a grinding process) may be performed to remove excess conductive material along the top surface of the dielectric layer 187, such that top surfaces of the conductive connectors 188 and the dielectric layer 187 are level.

Referring further to FIG. 13, a thinning process is performed on a second side of the substrate 180 to thin the substrate 180 until TVs 184 are exposed. The thinning process may include an etching process, a grinding process, the like, or a combination thereof.

FIG. 14 illustrates the formation of a redistribution structure 192 and conductive connectors 196 on the second side of the substrate 180. To form the redistribution structure 192, conductive pads 190 are first formed over the second side of the substrate 180, wherein the conductive pads 190 are physically and electrically connected to the TVs 184. In accordance with some embodiments, the conductive pads 190 may be formed by initially forming a seed layer (not shown) of one or more thin layers of a conductive material that aids in the formation of a thicker layer during subsequent processing steps. The seed layer may comprise a layer of titanium or copper formed using processes such as sputtering, evaporation, PECVD, or the like. A photoresist (also not shown) may then be formed and patterned to cover the seed layer using, e.g., a spin coating technique. Once the photoresist has been formed and patterned, a conductive material may be formed on the seed layer. The conductive material may be a material such as copper, titanium, tungsten, aluminum, another metal, the like, or a combination thereof. The conductive material may be formed through a deposition process such as electroplating, electroless plating, or the like. Once the conductive material has been formed, the photoresist may be removed through a suitable removal process such as ashing or chemical stripping. Additionally, after the removal of the photoresist, those portions of the seed layer that were covered by the photoresist may be removed through, for example, a suitable wet etch process or dry etch process, which may use the conductive material as an etch mask. The remaining portions of the seed layer and conductive material form the conductive pads 190.

The remainder of the redistribution structure 192 is then formed over the second side of the substrate 180 and the conductive pads 190. The redistribution structure 192 may include a metallization layer that comprises one or more dielectric layer(s) and respective metallization pattern(s) in the dielectric layer(s). The metallization patterns may comprise vias and/or traces to interconnect the TVs 184 together and/or to an external device. The dielectric layers may comprise silicon oxide, silicon nitride, silicon carbide, silicon oxynitride, low-K dielectric material, such as PSG, BPSG, FSG, SiOxCy, Spin-On-Glass, Spin-On-Polymers, silicon carbon material, compounds thereof, composites thereof, combinations thereof, or the like. The dielectric layers may be deposited by any suitable method known in the art, such as spinning, CVD, PECVD, HDP-CVD, or the like. A metallization pattern may be formed in the dielectric layer, for example, by using photolithography techniques to deposit and pattern a photoresist material on the dielectric layer to expose portions of the dielectric layer that are to become the metallization pattern. An etch process, such as an anisotropic dry etch process, may be used to create recesses and/or openings in the dielectric layer corresponding to the exposed portions of the dielectric layer. The recesses and/or openings may be lined with a diffusion barrier layer and filled with a conductive material. The diffusion barrier layer may comprise one or more layers of TaN, Ta, TiN, Ti, CoW, or the like, deposited by ALD, or the like, and the conductive material may comprise copper, aluminum, tungsten, silver, and combinations thereof, or the like, deposited by CVD, PVC, or the like. Any excessive diffusion barrier layer and/or conductive material on the dielectric layer may be removed, such as by using a CMP.

Referring further to FIG. 14, conductive pads 195 are formed at a top surface of the redistribution structure 192. The conductive pads 195 are formed in openings of the dielectric layers of the redistribution structure 192. The openings are formed using acceptable photolithography and etching processes, and the openings may expose a topmost metallization pattern of the redistribution structure 192. In some embodiments, the conductive pads 195 include under bump metallurgies (UBMs). As an example to form the conductive pads 195, a seed layer (not shown) is formed at least in the openings in the dielectric layer of the redistribution structure 192. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the conductive pads 195. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the conductive pads 195.

Conductive connectors 196 are then formed on the conductive pads 195. The conductive connectors 196 are electrically coupled to the redistribution structure 192 and the TVs 184 through the conductive pads 195. The conductive connectors 196 may comprise micro bumps, solder balls, or the like. The conductive connectors 196 may comprise a conductive material such as solder, copper, aluminum, gold, nickel, silver, palladium, tin, the like, or a combination thereof. In some embodiments, the conductive connectors 196 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 196 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may comprise nickel, tin, tin-lead, gold, silver, palladium, indium, nickel-palladium-gold, nickel-gold, the like, or a combination thereof and may be formed by a plating process.

Figure 15:
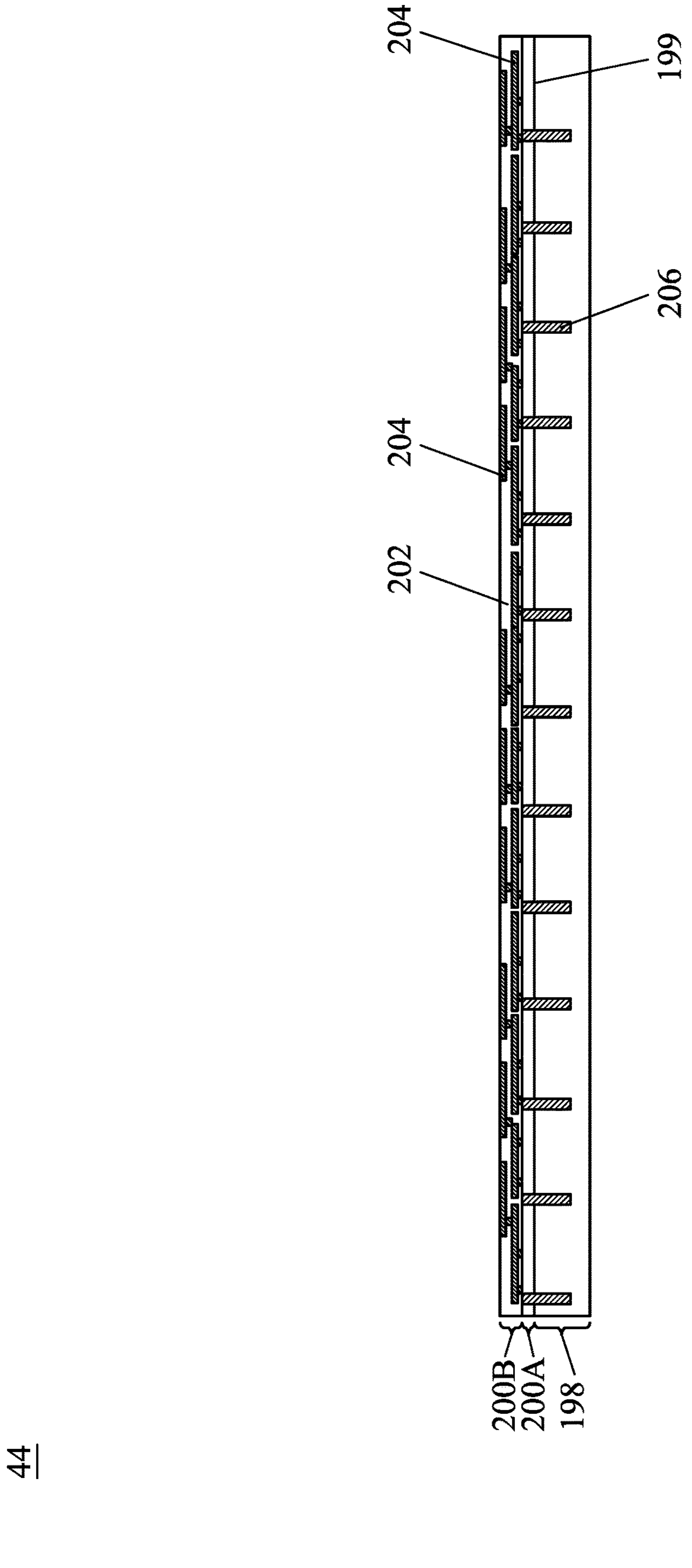
FIGS. 15 through 17 illustrate cross-sectional views of a second interposer at various stages of manufacturing, in accordance with an embodiment.
Figure 16:
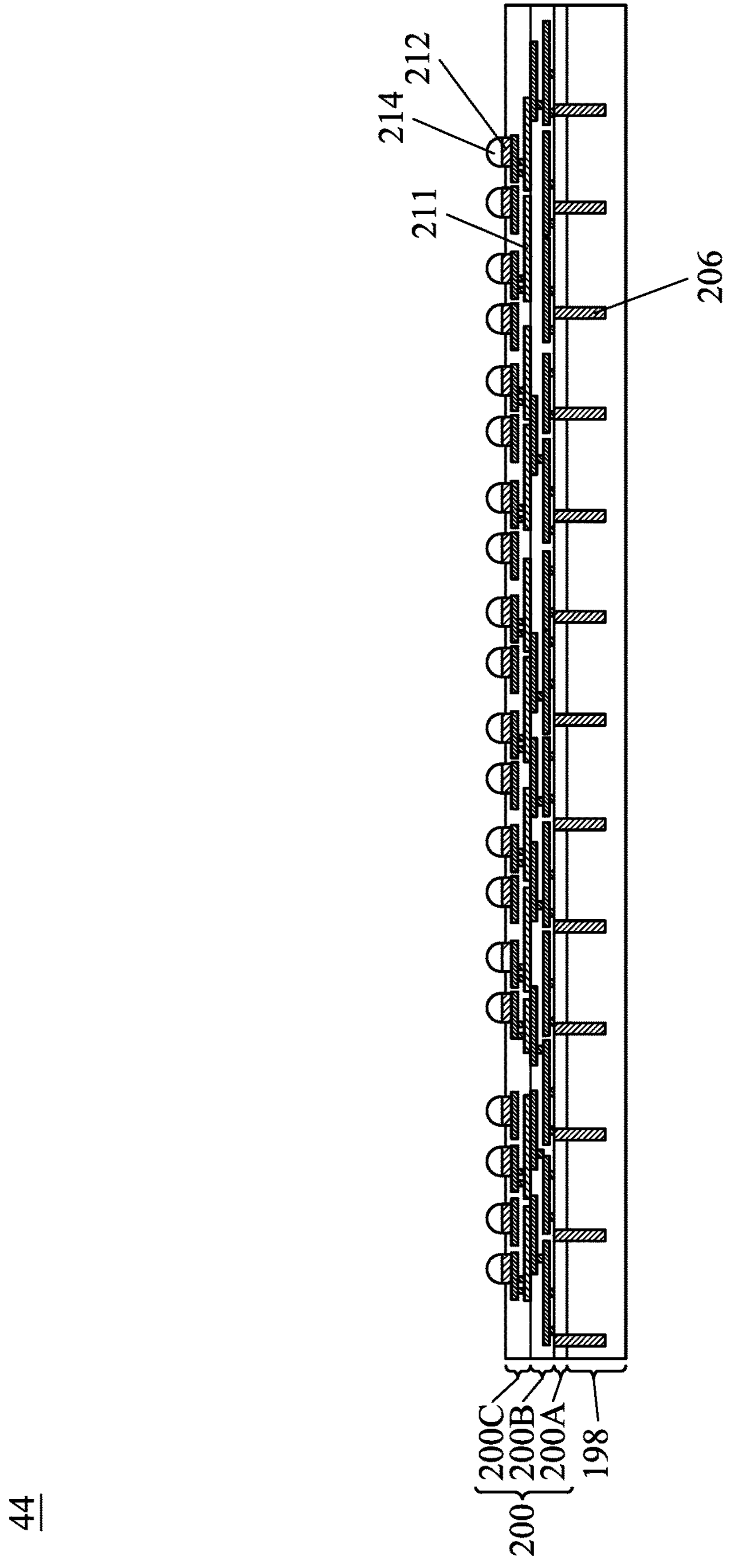
Figure 17:
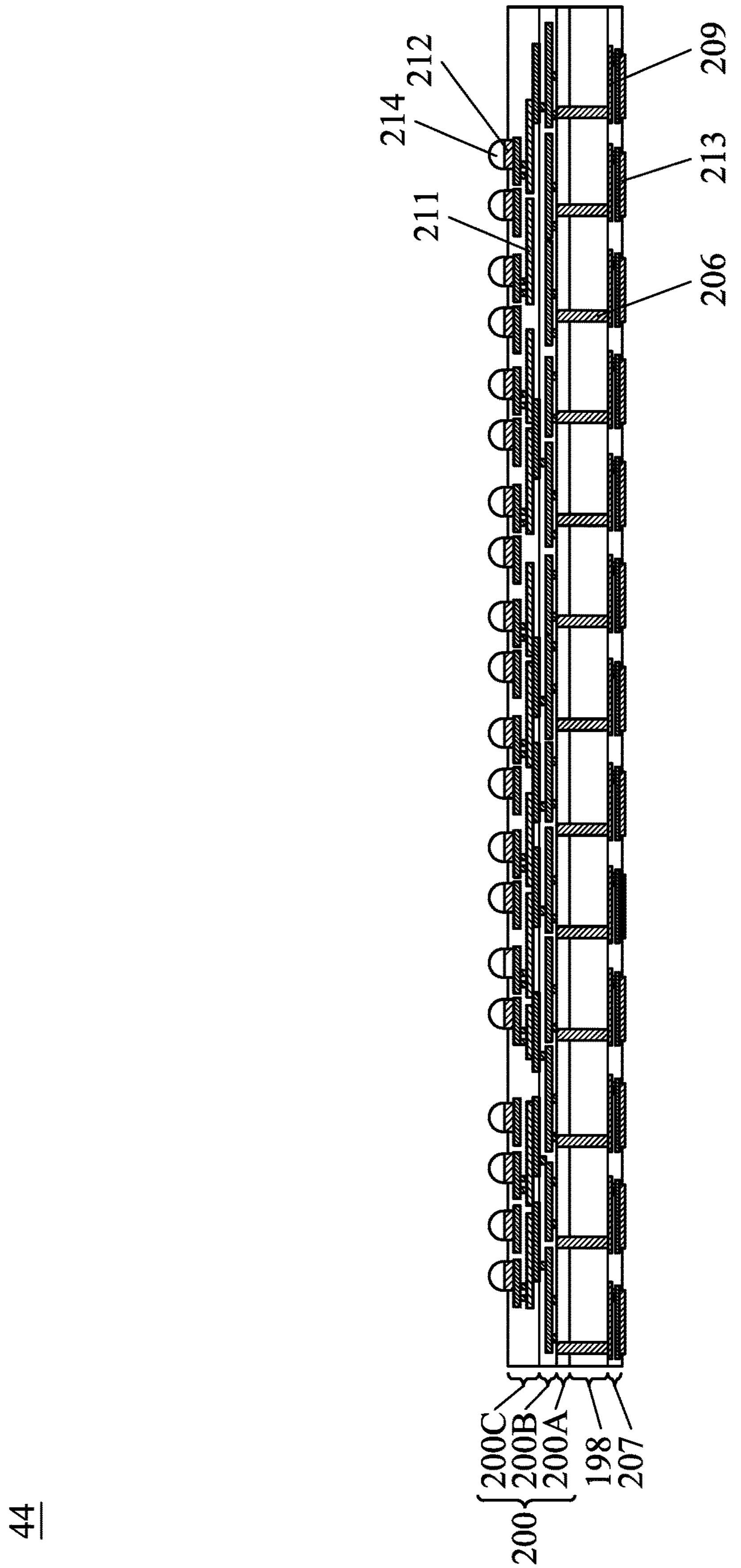

FIGS. 15 to 17 illustrate cross-sectional views of a second interposer 44 at various stages of manufacturing, in accordance with an embodiment. FIGS. 15 to 17 also illustrate the formation of a second metallization layer 200 over a substrate 198 of the second interposer 44. The second metallization layer 200 comprises a first portion 200A of the second metallization layer 200, a second portion 200B of the second metallization layer 200, and a third portion 200C of the second metallization layer 200. The second interposer 44 comprises the substrate 198, in accordance with some embodiments. The substrate 198 can be a wafer. The substrate 198 may comprise a bulk semiconductor substrate, SOI substrate, multi-layered semiconductor substrate, or the like. The semiconductor material of the substrate 198 may be silicon, germanium, a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP, or combinations thereof. Other substrates, such as multi-layered or gradient substrates, may also be used. The substrate 198 may be doped or undoped. The substrate 198 will generally not include active devices therein, although it may include passive devices formed in and/or on a first surface 199 on a first side of the substrate 198.

The first portion 200A of the second metallization layer 200 is formed over the first surface 199 of the substrate 198, and is used to electrically connect the subsequently formed TVs 206 together and/or to external devices. The first portion 200A of the second metallization layer 200 may include one or more dielectric layer(s) and respective metallization pattern(s) in the dielectric layer(s). The metallization patterns may comprise vias and/or traces to interconnect the TVs 206 together and/or to an external device. The dielectric layers may comprise silicon oxide, silicon nitride, silicon carbide, silicon oxynitride, low-K dielectric material, such as PSG, BPSG, FSG, SiOxCy, Spin-On-Glass, Spin-On-Polymers, silicon carbon material, compounds thereof, composites thereof, combinations thereof, or the like. The dielectric layers may be deposited by any suitable method known in the art, such as spinning, CVD, PECVD, HDP-CVD, or the like. A metallization pattern may be formed in the dielectric layer, for example, by using photolithography techniques to deposit and pattern a photoresist material on the dielectric layer to expose portions of the dielectric layer that are to become the metallization pattern. An etch process, such as an anisotropic dry etch process, may be used to create recesses and/or openings in the dielectric layer corresponding to the exposed portions of the dielectric layer. The recesses and/or openings may be lined with a diffusion barrier layer and filled with a conductive material. The diffusion barrier layer may comprise one or more layers of TaN, Ta, TiN, Ti, CoW, or the like, deposited by ALD, or the like, and the conductive material may comprise copper, aluminum, tungsten, silver, and combinations thereof, or the like, deposited by CVD, PVC, or the like. Any excessive diffusion barrier layer and/or conductive material on the dielectric layer may be removed, such as by using a CMP.

Through-vias (TVs) 206 are formed to extend through the substrate 198 and through the first portion 200A of the second metallization layer 200. The TVs 206 may be formed by forming recesses in the substrate 198 and the first portion 200A of the second metallization layer 200 by, for example, etching, milling, laser techniques, a combination thereof, and/or the like. A thin dielectric material may be formed in the recesses, such as by using an oxidation technique. A thin barrier layer may be conformally deposited over the front side of the substrate 198 and in the openings, such as by CVD, ALD, PVD, thermal oxidation, a combination thereof, and/or the like. The barrier layer may comprise a nitride or an oxynitride, such as titanium nitride, titanium oxynitride, tantalum nitride, tantalum oxynitride, tungsten nitride, a combination thereof, and/or the like. A conductive material may be deposited over the thin barrier layer and in the openings. The conductive material may be formed by an electro-chemical plating process, CVD, ALD, PVD, a combination thereof, and/or the like. Examples of conductive materials are copper, tungsten, aluminum, silver, gold, a combination thereof, and/or the like. Excess conductive material and barrier layer is removed by, for example, CMP. Thus, the TVs 206 may comprise a conductive material and a thin barrier layer between the conductive material and the substrate 198. After the formation of the TVs 206, the second portion 200B of the second metallization layer 200 is formed over the first portion 200A of the second metallization layer 200 and the TVs 206. The second portion 200B of the second metallization layer 200 is formed using similar processes and similar materials as the first portion 200A of the second metallization layer 200.

FIG. 16 illustrates the formation of the third portion 200C of the second metallization layer 200 and conductive connectors 214 over the second portion 200B of the second metallization layer 200. To form the third portion 200C of the second metallization layer 200, conductive pads 211 are first formed over the second portion 200B of the second metallization layer 200, wherein the conductive pads 211 are physically and electrically connected to the TVs 206 through the second portion 200B of the second metallization layer 200. In accordance with some embodiments, the conductive pads 211 may be formed by initially forming a seed layer (not shown) of one or more thin layers of a conductive material that aids in the formation of a thicker layer during subsequent processing steps. The seed layer may comprise a layer of titanium or copper formed using processes such as sputtering, evaporation, PECVD, or the like. A photoresist (also not shown) may then be formed and patterned to cover the seed layer using, e.g., a spin coating technique. Once the photoresist has been formed and patterned, a conductive material may be formed on the seed layer. The conductive material may be a material such as copper, titanium, tungsten, aluminum, another metal, the like, or a combination thereof. The conductive material may be formed through a deposition process such as electroplating, electroless plating, or the like. Once the conductive material has been formed, the photoresist may be removed through a suitable removal process such as ashing or chemical stripping. Additionally, after the removal of the photoresist, those portions of the seed layer that were covered by the photoresist may be removed through, for example, a suitable wet etch process or dry etch process, which may use the conductive material as an etch mask. The remaining portions of the seed layer and conductive material form the conductive pads 211.

The remainder of the third portion 200C of the second metallization layer 200 is then formed over the second portion 200B of the second metallization layer 200 and the conductive pads 211. The third portion 200C of the second metallization layer 200 may be formed using similar materials and similar materials as the second portion 200B of the second metallization layer 200. In an embodiment, a material of the dielectric layers of the third portion 200C of the second metallization layer 200 and a material of the dielectric layers of the second portion 200B of the second metallization layer 200 is different.

Referring further to FIG. 16, conductive pads 212 are formed at a top surface of the third portion 200C of the second metallization layer 200. The conductive pads 212 are formed in openings of the dielectric layers of the third portion 200C of the second metallization layer 200. The openings are formed using acceptable photolithography and etching processes, and the openings may expose a topmost metallization pattern of the third portion 200C of the second metallization layer 200. In some embodiments, the conductive pads 212 include under bump metallurgies (UBMs). As an example to form the conductive pads 212, a seed layer (not shown) is formed at least in the openings in the dielectric layer of the third portion 200C of the second metallization layer 200. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the conductive pads 212. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the conductive pads 212.

Conductive connectors 214 are then formed on the conductive pads 212. The conductive connectors 214 are electrically coupled to the third portion 200C of the second metallization layer 200, the second portion 200B of the second metallization layer 200 and the TVs 206 through the conductive pads 212. The conductive connectors 214 may comprise micro bumps, solder balls, or the like. The conductive connectors 214 may comprise a conductive material such as solder, copper, aluminum, gold, nickel, silver, palladium, tin, the like, or a combination thereof. In some embodiments, the conductive connectors 214 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 214 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may comprise nickel, tin, tin-lead, gold, silver, palladium, indium, nickel-palladium-gold, nickel-gold, the like, or a combination thereof and may be formed by a plating process.

In FIG. 17, a thinning process is performed on a second side of the substrate 198 to thin the substrate 198 until TVs 206 are exposed. The thinning process may include an etching process, a grinding process, the like, or a combination thereof.

FIG. 17 further illustrates the formation of a redistribution structure 207 on the second side of the substrate 198. To form the redistribution structure 207, conductive pads 209 are first formed over the second side of the substrate 198, wherein the conductive pads 209 are physically and electrically connected to the TVs 206. In accordance with some embodiments, the conductive pads 209 may be formed by initially forming a seed layer (not shown) of one or more thin layers of a conductive material that aids in the formation of a thicker layer during subsequent processing steps. The seed layer may comprise a layer of titanium or copper formed using processes such as sputtering, evaporation, PECVD, or the like. A photoresist (also not shown) may then be formed and patterned to cover the seed layer using, e.g., a spin coating technique. Once the photoresist has been formed and patterned, a conductive material may be formed on the seed layer. The conductive material may be a material such as copper, titanium, tungsten, aluminum, another metal, the like, or a combination thereof. The conductive material may be formed through a deposition process such as electroplating, electroless plating, or the like. Once the conductive material has been formed, the photoresist may be removed through a suitable removal process such as ashing or chemical stripping. Additionally, after the removal of the photoresist, those portions of the seed layer that were covered by the photoresist may be removed through, for example, a suitable wet etch process or dry etch process, which may use the conductive material as an etch mask. The remaining portions of the seed layer and conductive material form the conductive pads 209.

The remainder of the redistribution structure 207 is then formed over the second side of the substrate 198 and the conductive pads 209. The redistribution structure 207 includes a metallization layer that comprises one or more dielectric layer(s) and respective metallization pattern(s) in the dielectric layer(s). The metallization patterns may comprise vias and/or traces to interconnect the TVs 206 together and/or to an external device. The dielectric layers may comprise silicon oxide, silicon nitride, silicon carbide, silicon oxynitride, low-K dielectric material, such as PSG, BPSG, FSG, SiOxCy, Spin-On-Glass, Spin-On-Polymers, silicon carbon material, compounds thereof, composites thereof, combinations thereof, or the like. The dielectric layers may be deposited by any suitable method known in the art, such as spinning, CVD, PECVD, HDP-CVD, or the like. A metallization pattern may be formed in the dielectric layer, for example, by using photolithography techniques to deposit and pattern a photoresist material on the dielectric layer to expose portions of the dielectric layer that are to become the metallization pattern. An etch process, such as an anisotropic dry etch process, may be used to create recesses and/or openings in the dielectric layer corresponding to the exposed portions of the dielectric layer. The recesses and/or openings may be lined with a diffusion barrier layer and filled with a conductive material. The diffusion barrier layer may comprise one or more layers of TaN, Ta, TiN, Ti, CoW, or the like, deposited by ALD, or the like, and the conductive material may comprise copper, aluminum, tungsten, silver, and combinations thereof, or the like, deposited by CVD, PVC, or the like. Any excessive diffusion barrier layer and/or conductive material on the dielectric layer may be removed, such as by using a CMP.

Referring further to FIG. 17, conductive pads 213 are formed at a top surface of the redistribution structure 207. The conductive pads 213 are formed in openings of the dielectric layers of the redistribution structure 207. The openings are formed using acceptable photolithography and etching processes, and the openings may expose a topmost metallization pattern of the redistribution structure 207. In some embodiments, the conductive pads 213 include under bump metallurgies (UBMs). As an example to form the conductive pads 213, a seed layer (not shown) is formed at least in the openings in the dielectric layer of the redistribution structure 207. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the conductive pads 213. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the conductive pads 213.

Figure 18:
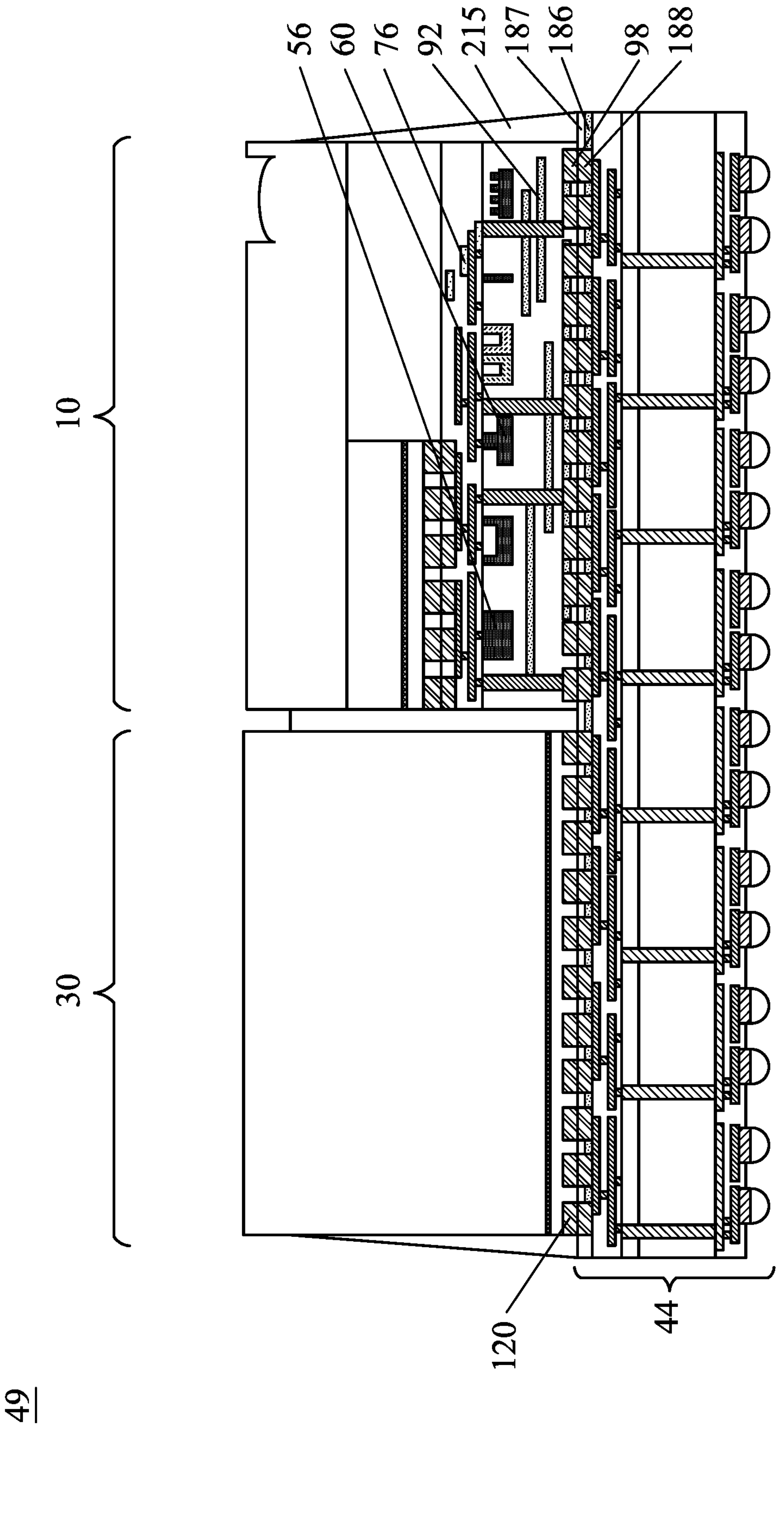
FIGS. 18 through 20 illustrate cross-sectional views of a package 45 at various stages of manufacturing, in accordance with an embodiment.

In FIG. 18, the package component 30 and the package component 10 are bonded to the first interposer 42 to form a package component 49. In an embodiment, the fourth optical components 186 extend under both the package component 10 and the package component 30. In some embodiments, the package component 30 and the package component 10 are bonded to the first interposer 42 by dielectric-to-dielectric bonding and/or metal-to-metal bonding. In such embodiments, covalent bonds may be formed between oxide layers, such as the dielectric layer 122 of the package component 30 and the dielectric layer 187 of the first interposer 42. Further covalent bonds may be formed between oxide layers, such as the dielectric layer 96 of the package component 10 and the dielectric layer 187 of the first interposer 42. During the bonding, metal bonding may also occur between the die connectors 120 of the package component 30 and the conductive connectors 188 of the first interposer 42. Further metal bonding may also occur between the conductive connectors 98 of the package component 10 and the conductive connectors 188 of the first interposer 42.

In some embodiments, before performing the bonding process, a surface treatment is performed on the package component 30 and the package component 10. In some embodiments, the top surfaces of the dielectric layer 187 and/or the dielectric layer 122 and the dielectric layer 96 may first be activated utilizing, for example, a dry treatment, a wet treatment, a plasma treatment, exposure to an inert gas, exposure to $H_2$, exposure to $N_2$, exposure to $O_2$, the like, or combinations thereof. However, any suitable activation process may be utilized. After the activation process, the dielectric layer 187 and/or the dielectric layer 122 and the dielectric layer 96 may be cleaned using, e.g., a chemical rinse. The package component 30 and the package component 10 are then aligned with the first interposer 42 and placed into physical contact with the first interposer 42. The package component 30 and the package component 10 may be placed on the first interposer 42 using a pick-and-place process, for example. An example bonding process includes directly bonding the dielectric layer 187 of the first interposer 42 and the dielectric layer 122 of the package component 30 through fusion bonding. In addition, the bonding process includes directly bonding the dielectric layer 187 of the first interposer 42 and the dielectric layer 96 of the package component 10 through fusion bonding. In an embodiment, the bond between the dielectric layer 187 of the first interposer 42 and the dielectric layer 122 of the package component 30 may be an oxide-to-oxide bond. In an embodiment, the bond between the dielectric layer 187 of the first interposer 42 and the dielectric layer 96 of the package component 10 may be an oxide-to-oxide bond. The bonding process also directly bonds die connectors 120 of the package component 30 and the conductive connectors 188 through direct metal-to-metal bonding. The bonding process further directly bonds the conductive connectors 98 of the package component 10 and the conductive connectors 188 through direct metal-to-metal bonding. Thus, the package component 30 and the first interposer 42 are electrically connected, and the package component 10 and the first interposer 42 are electrically connected. This process starts with aligning the die connectors 120 to the conductive connectors 188, such that the die connectors 120 overlap with corresponding conductive connectors 188. In addition, it includes aligning the conductive connectors 98 and the conductive connectors 188, such that the conductive connectors 98 overlap with corresponding conductive connectors 188. Next, a pre-bonding step is performed, during which the package component 30 and the package component 10 are put in contact with the first interposer 42. The bonding process continues with performing an anneal, for example, at a temperature between about 100° C. and about 450° C. for a duration between about 0.5 hours and about 3 hours, so that the metal in the die connectors 120 and the conductive connectors 188 inter-diffuses to each other, and the metal in the conductive connectors 98 and the conductive connectors 188 inter-diffuses to each other, and hence the direct metal-to-metal bonding is formed. After the package component 30 and the package component 10 are bonded to the first interposer 42, the photonic components (e.g. the waveguides 56 and 60) of the first active layer 63 may be optically coupled to the waveguides of the second optical components 76, the waveguides of the third optical components 92, and the waveguides of the fourth optical components 186.

Advantageous features may be achieved by having the package component 10 and the package component 30 bonded to the first interposer 42 using both metal-to-metal bonding and dielectric-to-dielectric bonding. The bonding includes directly bonding the dielectric layer 187 of the first interposer 42 and the dielectric layer 122 of the package component 30 through fusion bonding. In addition, the bonding includes directly bonding the dielectric layer 187 of the first interposer 42 and the dielectric layer 96 of the package component 10 through fusion bonding. The bonding process also directly bonds die connectors 120 of the package component 30 and the conductive connectors 188 through direct metal-to-metal bonding. In addition, the bonding process directly bonds the conductive connectors 98 of the package component 10 and the conductive connectors 188 through direct metal-to-metal bonding. These advantages include the metal-to-metal bonds and dielectric-to-dielectric bonds allowing for faster signal and data transmission rates between the package component 10 and the first interposer 42, and between the package component 30 and the first interposer 42, with reduced power consumption during data and signal transmission.

Further advantageous features may be achieved by the second interposer 44 comprising the fourth optical components 186 (e.g., the silicon nitride waveguide) under the package component 10 and the package component 30, wherein the fourth optical components 186 enables optical communication between the package component 10 and the package component 30. These advantages include allowing for faster signal and data transmission rates between the package component 10 and the package component 30, with reduced power consumption during data and signal transmission.

An underfill material 215 is then dispensed into the gap between the package component 10 and the package component 30. In some embodiments, the underfill material 215 may extend up along sidewalls of the package component 10 and the package component 30. The underfill material 215 is also formed over top surfaces of the first interposer 42 such as over and in physical contact with the dielectric layer 187. The underfill material 215 may be any acceptable material, such as a polymer, epoxy, molding underfill, or the like. The underfill material 215 may be formed by a capillary flow process.

Figure 19:
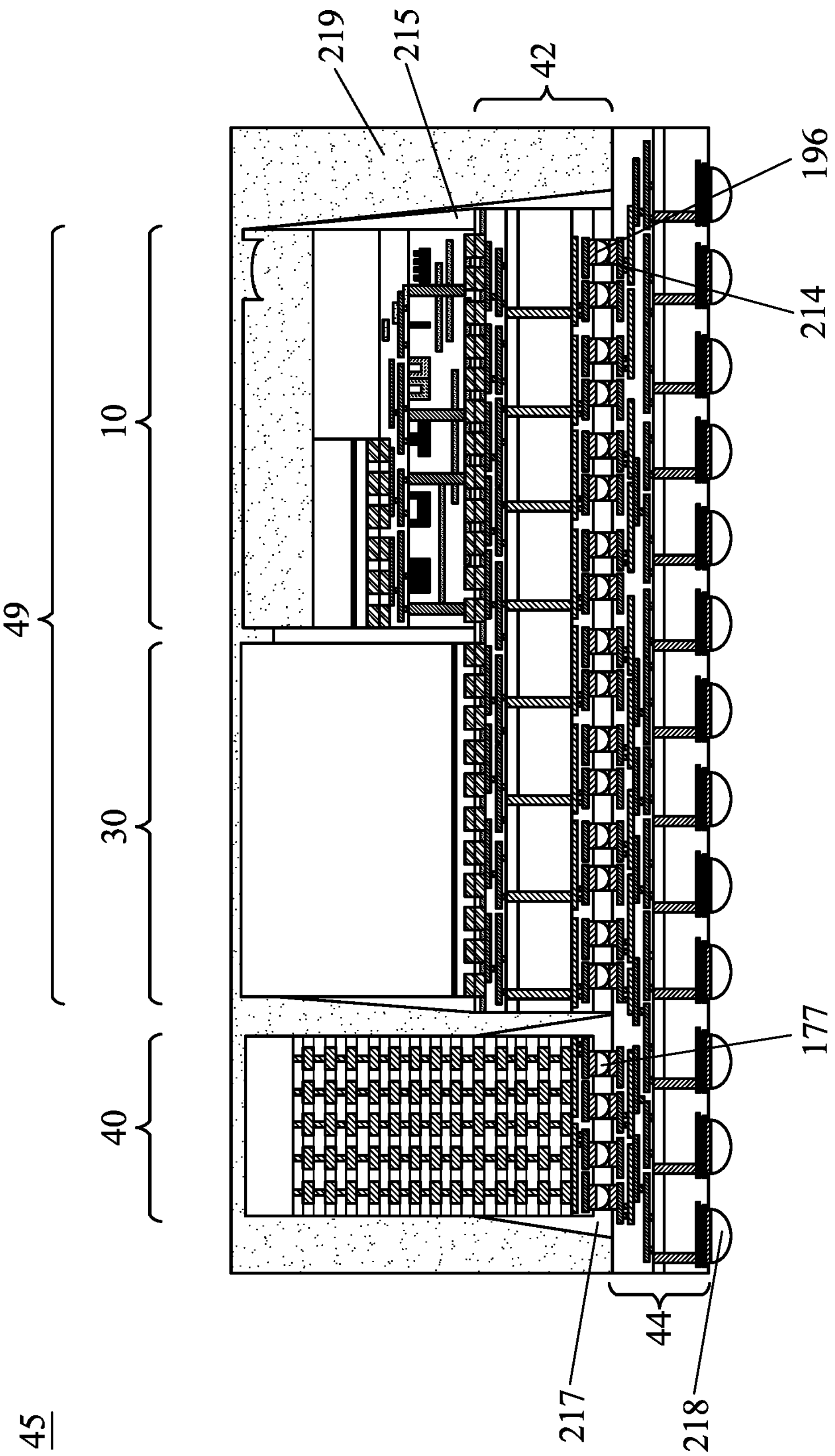

In FIG. 19, a mounting process is performed to place the package component 49 (comprising the package components 10 and 30) and the package component 40 onto the second interposer 44, such that the conductive connectors 196 of the package component 49 are in contact with respective conductive connectors 214 of the second interposer 44, and the conductive connectors 177 of the package component 40 are in contact with respective conductive connectors 214 of the second interposer 44. In an embodiment, the package component 49 and the package component 40 are placed into physical contact with the second interposer 44 using, e.g., a pick and place process. Once in physical contact, a reflow process may be utilized to bond and electrically couple the conductive connectors 196 with respective conductive connectors 214, and the conductive connectors 177 with respective conductive connectors 214.

Advantageous features may be achieved by bonding the package component 49 (comprising the package components 10 and 30) to the second interposer 44 by using bonding interconnects formed by coupling the conductive connectors 196 of the package component 49 to respective conductive connectors 214 of the second interposer 44. In addition, the package component 40 is bonded to the second interposer 44 by using bonding interconnects formed by coupling the conductive connectors 177 of the package component 40 to respective conductive connectors 214 of the second interposer 44. These advantages include the bonding interconnects allowing for improved signal and data transmission rates accompanied by reduced power consumption. Further, using the bonding interconnects to couple the package component 49 to the second interposer 44, and to couple the package component 40 to the second interposer 44 allows for a reduction in size of the bonding interconnects, and consequently allows for a reduced size of the package 45.

An underfill material 217 is dispensed into the gap between the package component 49 and the second interposer 44, and into the gap between the package component 40 and the second interposer 44. In some embodiments, the underfill material 217 may extend up along sidewalls of the package component 40 and the package component 49 (e.g., such as along sidewalls of the first interposer 42 and the underfill material 215. The underfill material 217 may be any acceptable material, such as a polymer, epoxy, molding underfill, or the like. The underfill material 217 may be formed by a capillary flow process after the package component 49 and the package component 40 are attached, or may be formed by a suitable deposition method before the package component 49 and the package component 40 are attached.

After dispensing the underfill material 217, an encapsulant 219, which may be a molding compound, a molding underfill, an epoxy, a resin, or the like, is applied to encapsulate package component 40 and the package component 49. The encapsulant 219 may also fill in a gap between the package component 30 and the package component 10. The recess of the micro lens 85 may be filed with encapsulant 219. Next, a planarization process is performed on encapsulant 219 to level its top surface.

Further referring to FIG. 19, conductive connectors 218 are then formed on the conductive pads 213. The conductive connectors 218 are electrically coupled to the TVs 206 through the conductive pads 213. The conductive connectors 218 may comprise solder balls, controlled collapse chip connection (C4) bumps, ball grid array (BGA) connectors, or the like. The conductive connectors 218 may comprise a conductive material such as solder, copper, aluminum, gold, nickel, silver, palladium, tin, the like, or a combination thereof. In some embodiments, the conductive connectors 218 are formed by initially forming a layer of solder through evaporation, electroplating, printing, solder transfer, ball placement, or the like. Once a layer of solder has been formed on the structure, a reflow may be performed in order to shape the material into the desired bump shapes.

Figure 20:
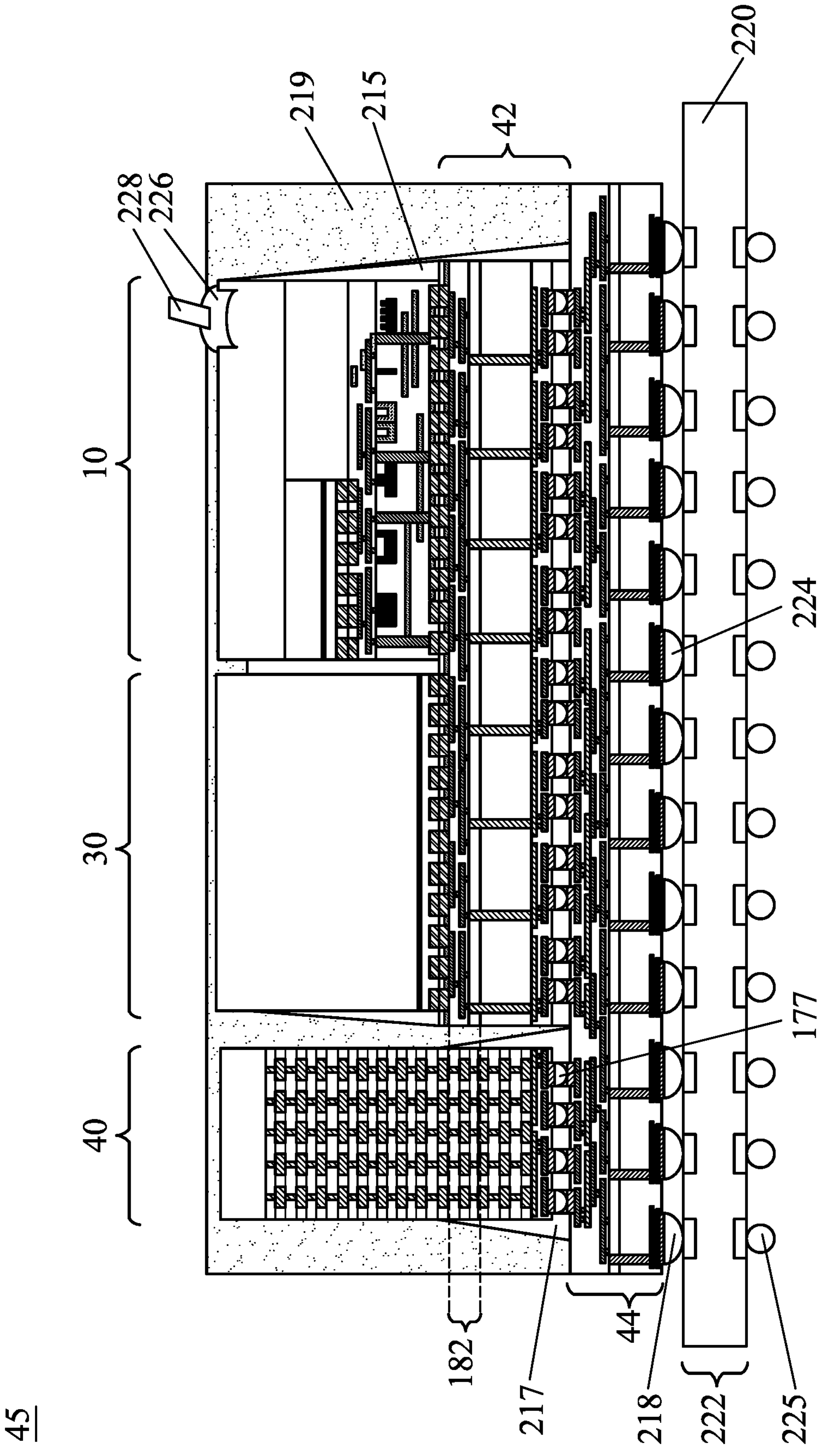

In FIG. 20, the package 45 is then mounted on a package substrate 222 using the conductive connectors 218. The package substrate 222 includes a substrate core 220 and bond pads 224 over the substrate core 220. The substrate core 220 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate core 220 may be a SOI substrate. Generally, an SOI substrate includes a layer of a semiconductor material such as epitaxial silicon, germanium, silicon germanium, SOI, SGOI, or combinations thereof. The substrate core 220 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for substrate core 220.

The substrate core 220 may include active and passive devices (not shown). A wide variety of devices such as transistors, capacitors, resistors, combinations of these, and the like may be used to generate the structural and functional requirements of the design for the device stack. The devices may be formed using any suitable methods.

The substrate core 220 may also include metallization layers and vias (not shown), with the bond pads 224 being physically and/or electrically coupled to the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate core 220 is substantially free of active and passive devices.

In some embodiments, the conductive connectors 218 are reflowed to attach the conductive connectors 218 to the bond pads 224. The conductive connectors 218 electrically and/or physically couple the package substrate 222, including metallization layers in the substrate core 220, to the package 45. In some embodiments, a solder resist is formed on the substrate core 220. The conductive connectors 218 may be disposed in openings in the solder resist to be electrically and mechanically coupled to the bond pads 224. The solder resist may be used to protect areas of the substrate core 220 from external damage.

Further referring to FIG. 20, the portion of the encapsulant 219 filling the recess of micro lens 85, is then removed. An optical fiber 228 is then vertically-mounted to the package component 10, and is aligned to the micro lens 85. The attachment may be performed using optical glue 226, which fills the recess of the micro lens 85.

Figure 21:
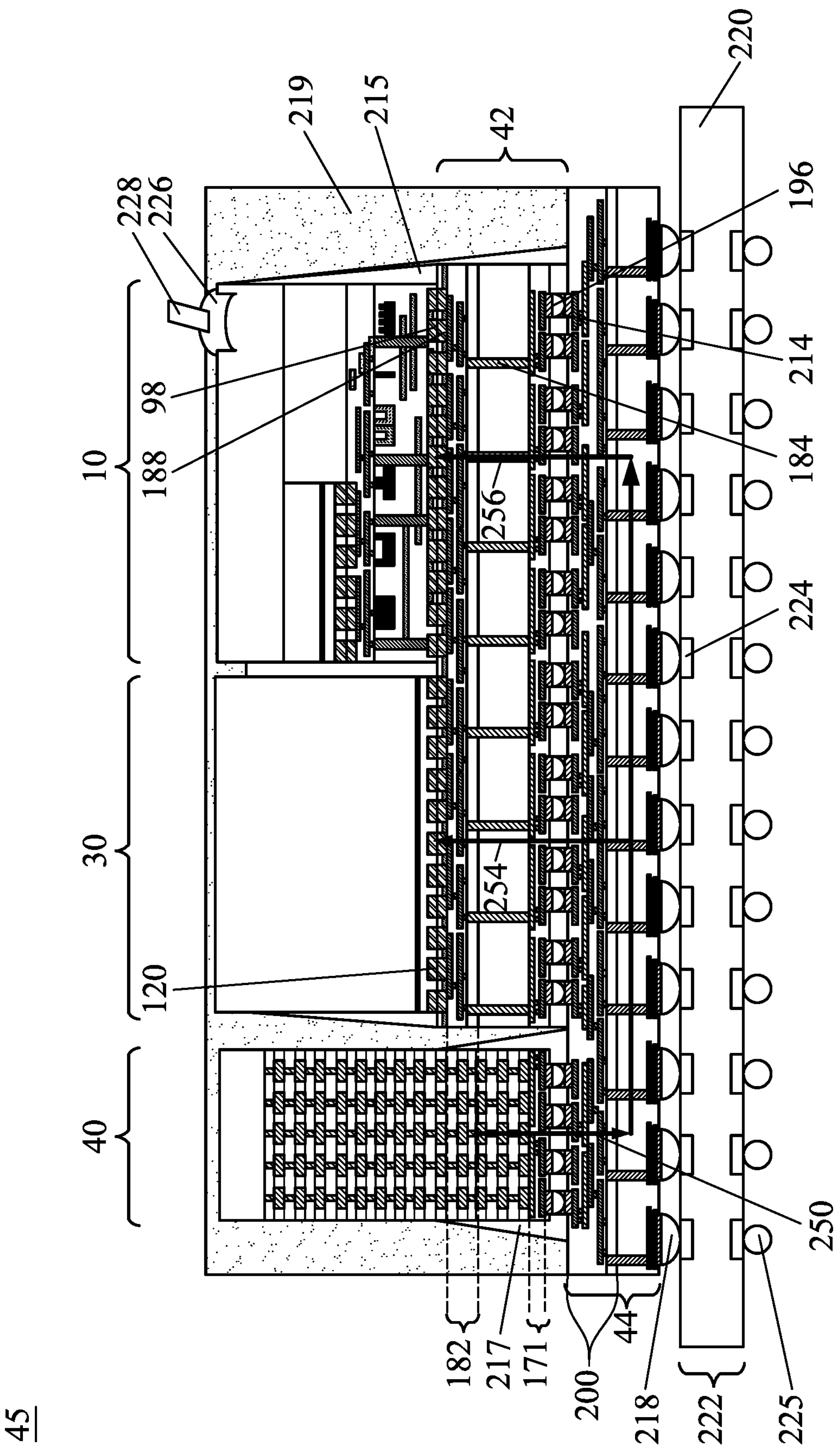
FIG. 21 illustrates electrical signals which are received, sent, and routed throughout a semiconductor package in accordance with an embodiment.

FIG. 21 illustrates arrows which represent a number of electrical signals which are received, sent, and routed throughout the first interposer 42, the second interposer 44, the package component 40, the package component 30, and the package component 10 of the package 45. These arrows represent a general direction that the electrical signals are routed within and between the first interposer 42, the second interposer 44, the package component 40, the package component 30, and the package component 10, and do not necessarily represent the exact path that the electrical signals travel through.

The routing paths of the electrical signals may include the package component 40 generating a first electrical signal 250 which is transmitted to the second interposer 44 through the interconnect structure 171, the conductive connectors 177 and the respectively coupled conductive connectors 214, and the second metallization layer 200. The first electrical signal 250 is then routed through the second metallization layer 200 of the second interposer 44. A second electrical signal 254 derived from a first portion of the first electrical signal 250 is routed to the first interposer 42 through the conductive connectors 214 and the respectively coupled conductive connectors 196. The second electrical signal 254 is further transmitted on to the package component 30 through the TVs 184, the first metallization layer 182, the conductive connectors 188 and the respectively coupled die connectors 120. A third electrical signal 256 derived from a second portion of the first electrical signal 250 is routed to the first interposer 42 through the conductive connectors 214 and the respectively coupled conductive connectors 196. The third electrical signal 256 is further transmitted on to the package component 10 through the TVs 184, the first metallization layer 182, the conductive connectors 188 and the respectively coupled conductive connectors 98, and the vias 94.

Figure 22:
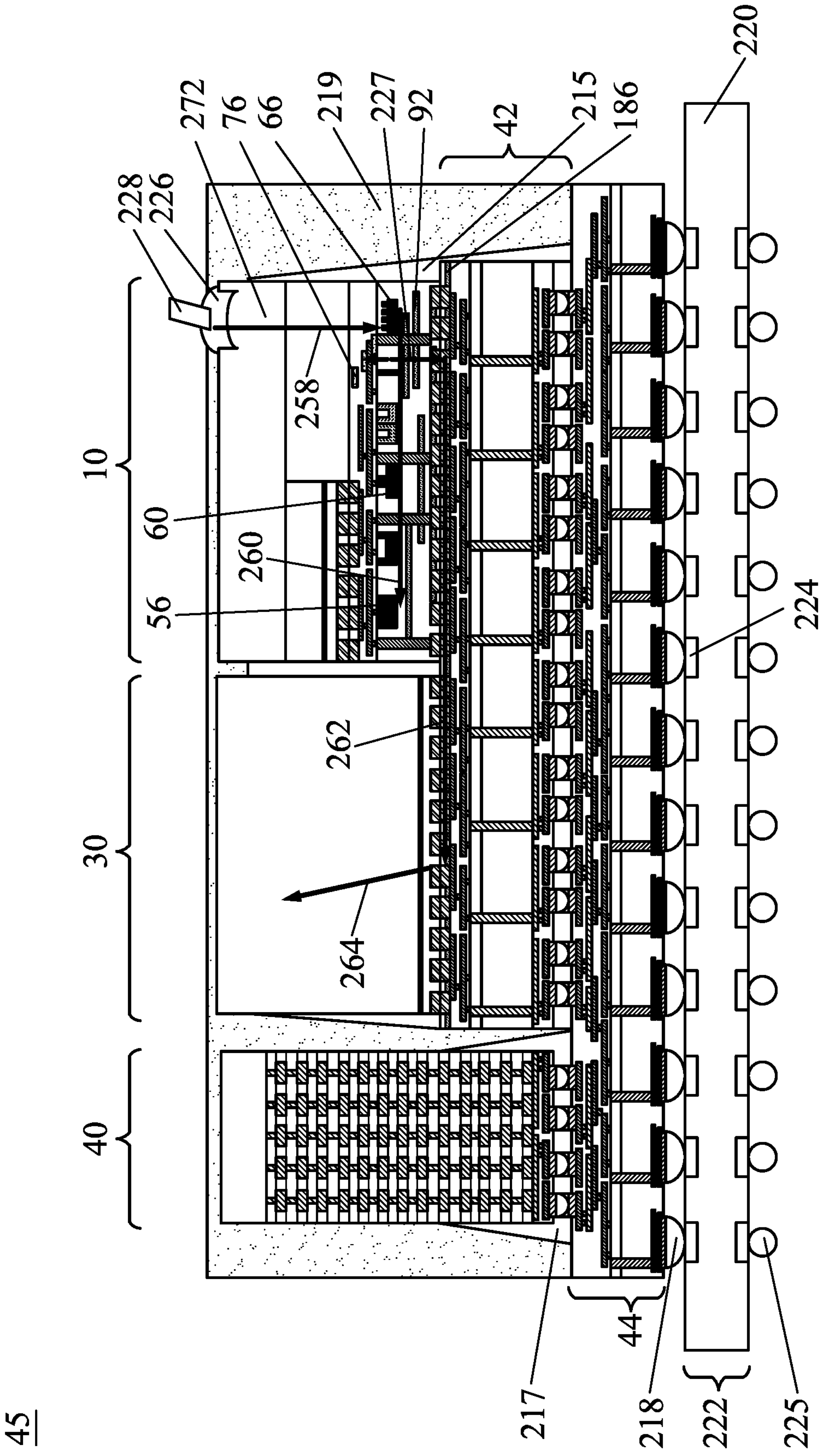
FIG. 22 illustrates optical signals which are received, sent, and routed throughout a semiconductor package, in accordance with an embodiment.

FIG. 22 illustrates arrows which represent a number of optical signals which are received, sent, and routed throughout the first interposer 42, the package component 30, and the package component 10 of the package 45. These arrows represent a general direction that the optical signals are routed within and between the first interposer 42, the package component 30, and the package component 10, and do not necessarily represent the exact path that the optical signals travel through.

The routing paths of the optical signals may include utilizing the coupler 66 to receive a first optical signal 258 from the optical fiber 228. The coupler 66 may be used to receive and redirect incoming, off-plane signals from the vertically-mounted optical fiber 228 into an adjacent, in-plane waveguide (e.g., the waveguide 56, and the slab waveguide 60) for transport into other photonic components of the first active layer 63, the third optical components 92, and the fourth optical components 186. For example, a second optical signal 260 derived from a first portion of the first optical signal 258 is routed to the first active layer 63 of photonic components and the third optical components 92 to be transported along in-plane directions of the waveguides (e.g., the waveguide 56 and/or 60) of the first active layer 63 and each of the third optical components 92. A third optical signal 262 derived from a second portion of the first optical signal 258 is routed to the first interposer 42 and transported along an in-plane direction of the patterned fourth optical components 186 (e.g., the patterned waveguides of the fourth optical components 186). The second optical signal 260 and the third optical signal 262 are transmitted along a light path 227 because of optical inter-coupling between neighboring waveguides (e.g., each of the third optical components 92 and the fourth optical components 186). When the horizontal distances between neighboring waveguides (e.g., each of the third optical components 92 and the fourth optical components 186) are small, e.g., when there is lateral overlapping, and also when the vertical distances between neighboring waveguides (e.g., each of the third optical components 92 and the fourth optical components 186) are small, light may optically inter-couple between the neighboring waveguides (e.g., each of the third optical components 92 and the fourth optical components 186). Accordingly, the light in each of the third optical components 92 may be optically coupled to the overlying waveguides of the first active layer 63 along the light path 227, and the light in the fourth optical components 186 may be optically coupled to the overlying waveguides of the first active layer 63 through the third optical components 92 along the light path 227. The third optical signal 262 is further transmitted in an in-plane direction through the fourth optical components 186 to a first region of the fourth optical components 186 that is overlapped by the package component 30. A fourth optical signal 264 derived from the third optical signal 262 is transmitted on to the package component 30. In this manner, optical signals received from the optical fiber 228 may be distributed through the package component 10 and further transmitted to the package component 30 through the fourth optical components 186.

Figure 23:
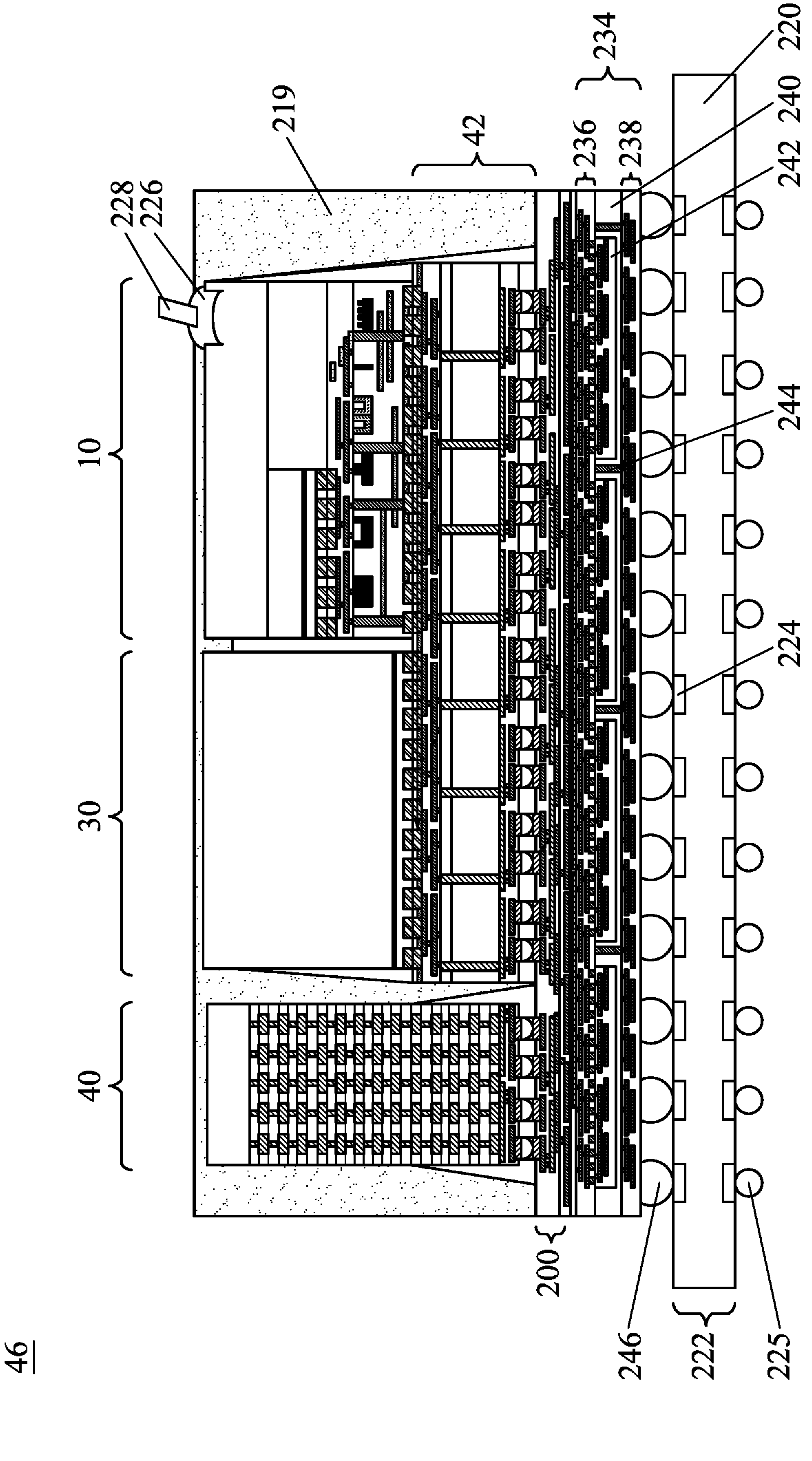
FIG. 23 illustrates a cross-sectional view of a semiconductor package, in accordance with another embodiment.

FIG. 23 illustrates a package 46, the package 46 being an alternate embodiment which may be similar to the package 45 of the FIGS. 1 through 22 where like reference numerals indicate like elements formed using like processes, unless specified otherwise. Accordingly, the process steps and applicable materials may not be repeated herein. The package 46 differs from the package 45 in that the package 46 comprises a Local Silicon Interconnect (LSI) interposer 234 instead of the second interposer 44. The LSI interposer 234 includes one or more LSI die(s) 242 built therein, or the like. Front-side RDLs 236 and backside RDLs 238 are formed on the front side and the backside of the LSI dies 242, respectively. The LSI dies 242 may be encapsulated in an encapsulant 240. Through-vias 244 may be formed to penetrate through the encapsulant 240, and may interconnect the front-side RDLs 236 and backside RDLs 238. The package component 40 and the package component 49 are electrically and physically coupled to the LSI interposer 234 through the second metallization layer 200 (described previously in FIGS. 15 to 17). Two or more package components (such as the package component 10, the package component 30, and the package component 40 may be interconnected through the metal lines built inside LSI dies 242, the second metallization layer 200, and the front-side RDLs 236. The LSI interposer 234 is coupled to the bond pads 224 on the package substrate 222 using conductive connectors 246. The conductive connectors 246 may be formed using similar processes and materials as those that were described for the formation of the conductive connectors 218 described above in FIGS. 19 and 20.

Advantageous features may be achieved by bonding the package component 49 (comprising the package component 10 and the package component 30) to the LSI interposer 234 by using bonding interconnects formed by coupling the conductive connectors 196 of the package component 49 to respective conductive connectors 214 of the LSI interposer 234. In addition, the package component 40 is bonded to the LSI interposer 234 by using bonding interconnects formed by coupling the conductive connectors 177 of the package component 40 to respective conductive connectors 214 of the LSI interposer 234. These advantages include the use of the bonding interconnects allowing for improved signal and data transmission rates accompanied by reduced power consumption. Further, using the bonding interconnects to couple the package component 49 to the LSI interposer 234, and to couple the package component 40 to the LSI interposer 234 allows for a reduction in size of the bonding interconnects, and consequently allows for a reduced size of the package 46.

Figure 24:
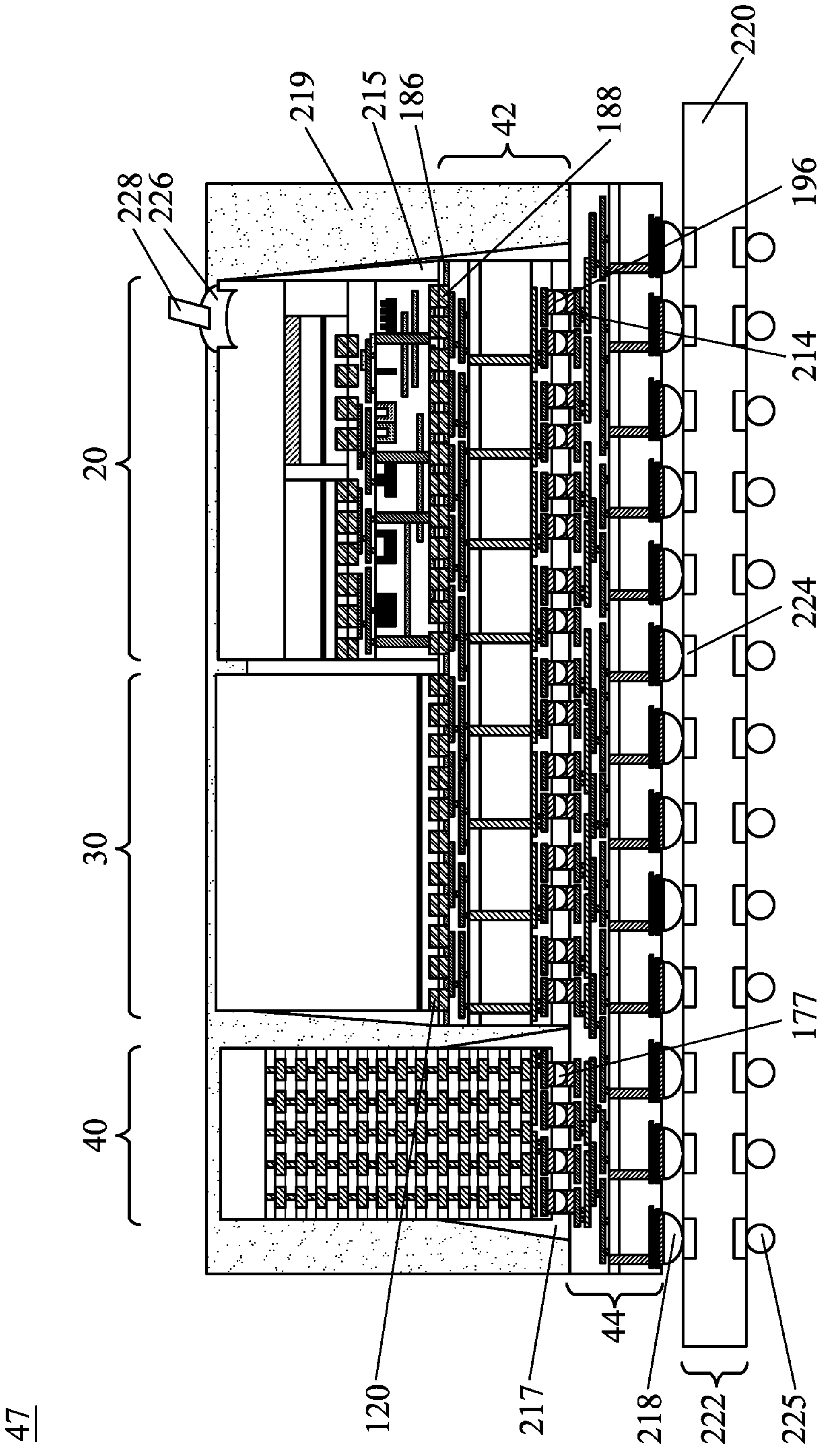
FIG. 24 illustrates a cross-sectional view of a package 47, in accordance with an embodiment.

FIG. 24 illustrates a package 47, the package 47 being an alternate embodiment which may be similar to the package 45 of the FIGS. 1 through 22 where like reference numerals indicate like elements formed using like processes, unless specified otherwise. Accordingly, the process steps and applicable materials may not be repeated herein. The package 47 differs from the package 45 in that the package 47 comprises a package component 20 (described earlier in FIG. 9) coupled to the first interposer 42 instead of the package component 10. The package component 20 is bonded to the first interposer 42 by dielectric-to-dielectric bonding and/or metal-to-metal bonding. In such embodiments, covalent bonds may be formed between oxide layers, such as the dielectric layer 96 of the package component 20 and the dielectric layer 187 of the first interposer 42. During the bonding, metal bonding may also occur between the conductive connectors 98 of the package component 20 and the conductive connectors 188 of the first interposer 42.

Advantageous features may be achieved by having the package component 20 and the package component 30 bonded to the first interposer 42 using both metal-to-metal bonding and dielectric-to-dielectric bonding. The bonding includes directly bonding the dielectric layer 187 of the first interposer 42 and the dielectric layer 122 of the package component 30 through fusion bonding. In addition, the bonding includes directly bonding the dielectric layer 187 of the first interposer 42 and the dielectric layer 96 of the package component 20 through fusion bonding. The bonding process also directly bonds die connectors 120 of the package component 30 and the conductive connectors 188 of the first interposer 42 through direct metal-to-metal bonding. In addition, the bonding process directly bonds the conductive connectors 98 of the package component 20 and the conductive connectors 188 of the first interposer 42 through direct metal-to-metal bonding. These advantages include the metal-to-metal bonds and dielectric-to-dielectric bonds allowing for faster signal and data transmission rates between the package component 20 and the first interposer 42, and between the package component 30 and the first interposer 42, with reduced power consumption during data and signal transmission.

Further advantageous features may be achieved by the second interposer 44 comprising the fourth optical components 186 (e.g., the silicon nitride waveguide) under the package component 20 and the package component 30, wherein the fourth optical components 186 enable optical communication between the package component 20 and the package component 30. These advantages include allowing for faster signal and data transmission rates between the package component 20 and the package component 30, with reduced power consumption during data and signal transmission.

Additional advantageous features may be achieved by bonding the package component 49 (comprising the package components 20 and 30) to the second interposer 44 by using bonding interconnects formed by coupling the conductive connectors 196 of the package component 49 to respective conductive connectors 214 of the second interposer 44. In addition, the package component 40 is bonded to the second interposer 44 by using bonding interconnects formed by coupling the conductive connectors 177 of the package component 40 to respective conductive connectors 214 of the second interposer 44. These advantages include the use of the bonding interconnects allowing for improved signal and data transmission rates accompanied by reduced power consumption. Further, using the bonding interconnects to couple the package component 49 to the second interposer 44, and to couple the package component 40 to the second interposer 44 allows for a reduction in size of the bonding interconnects, and consequently allows for a reduced size of the package 47.

Figure 25:
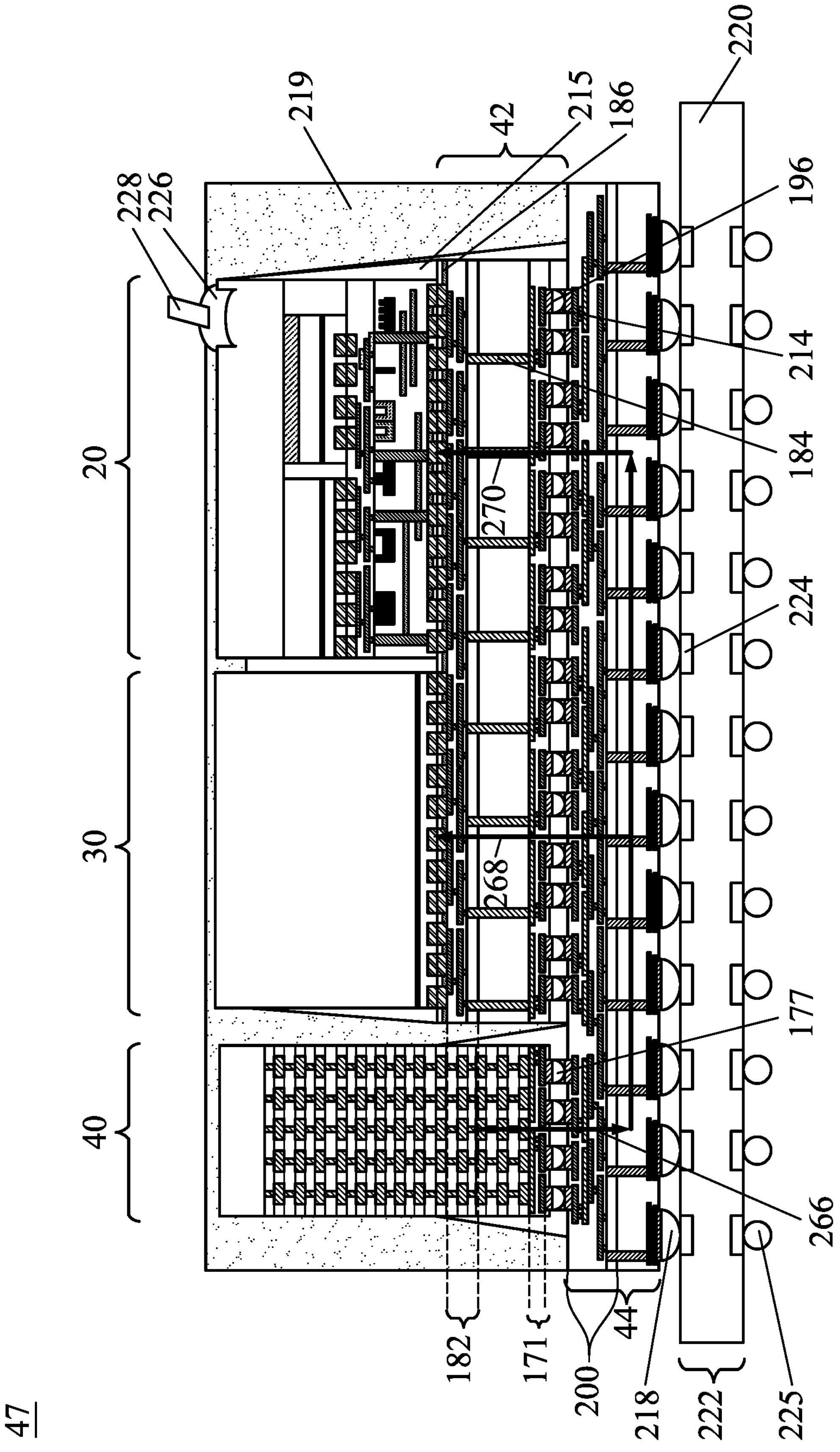
FIG. 25 illustrates electrical signals which are received, sent, and routed throughout a semiconductor package, in accordance with an embodiment.

FIG. 25 illustrates arrows which represent a number of electrical signals which are received, sent, and routed throughout the first interposer 42, the second interposer 44, the package component 40, the package component 30, and the package component 20 of the package 47. These arrows represent a general direction that the electrical signals are routed within and between the first interposer 42, the second interposer 44, the package component 40, the package component 30, and the package component 20, and do not necessarily represent the exact path that the electrical signals travel through.

The routing paths of the electrical signals may include the package component 40 generating a first electrical signal 266 which is transmitted to the second interposer 44 through the interconnect structure 171, the conductive connectors 177 and the respectively coupled conductive connectors 214, and the second metallization layer 200. The first electrical signal 266 is then routed through the second metallization layer 200 of the second interposer 44. A second electrical signal 268 derived from a first portion of the first electrical signal 266 is routed to the first interposer 42 through the conductive connectors 214 and the respectively coupled conductive connectors 196. The second electrical signal 268 is further transmitted on to the package component 30 through the TVs 184, the first metallization layer 182, the conductive connectors 188 and the respectively coupled die connectors 120. A third electrical signal 270 derived from a second portion of the first electrical signal 266 is routed to the first interposer 42 through the conductive connectors 214 and the respectively coupled conductive connectors 196. The third electrical signal 270 is further transmitted on to the package component 20 through the TVs 184, the first metallization layer 182, the conductive connectors 188 and the respectively coupled conductive connectors 98, and the vias 94.

Figure 26:
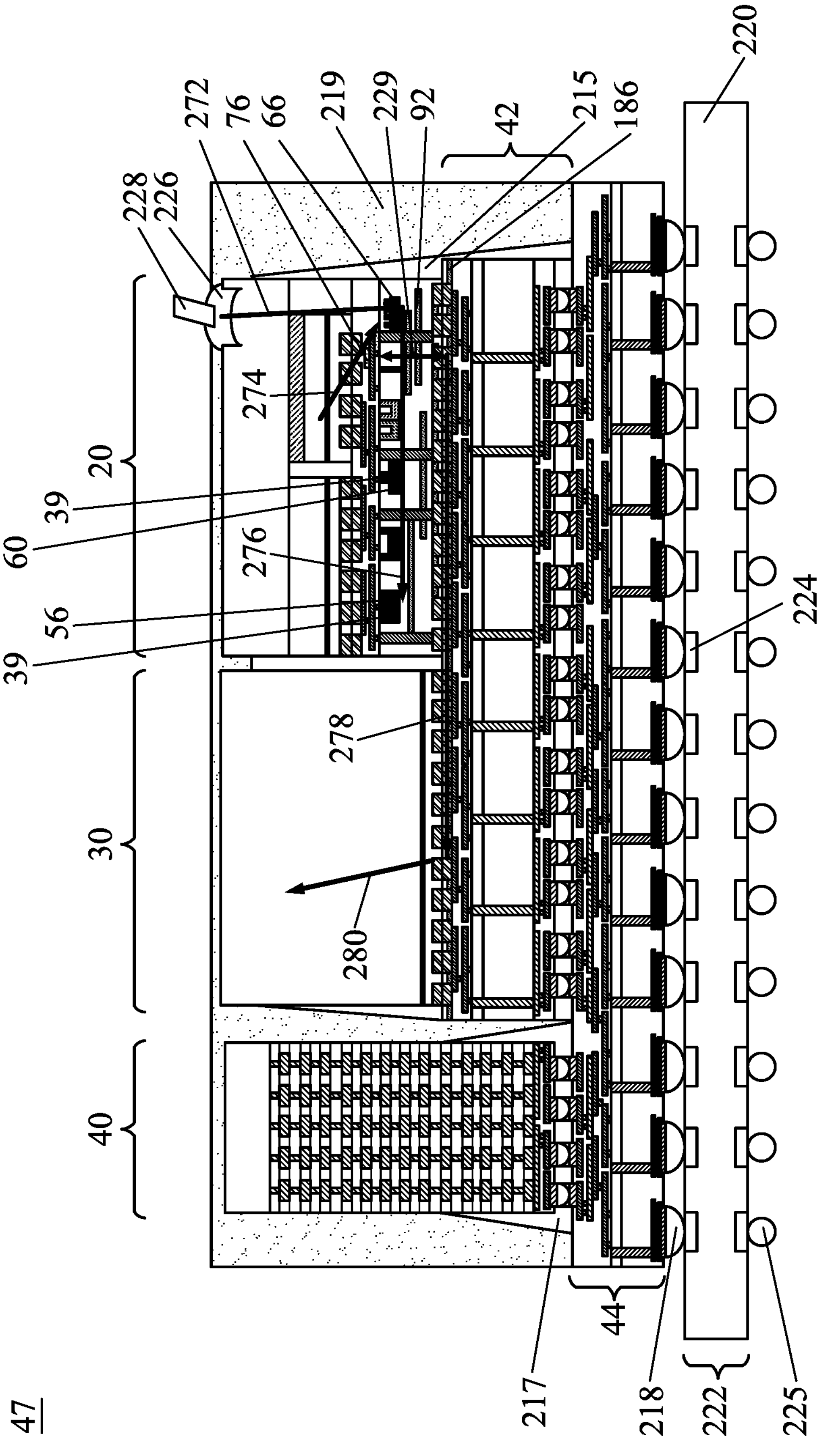
FIG. 26 illustrates optical signals which are received, sent, and routed throughout a semiconductor package, in accordance with an embodiment.

FIG. 26 illustrates arrows which represent a number of optical signals which are received, sent, and routed throughout the first interposer 42, the package component 30, and the package component 20 of the package 47. These arrows represent a general direction that the optical signals are routed within and between the first interposer 42, the package component 30, and the package component 20, and do not necessarily represent the exact path that the optical signals travel through.

The routing paths of the optical signals may include utilizing the coupler 66 to receive a first optical signal 272 from the optical fiber 228. The coupler 66 may be used to receive and redirect incoming, off-plane signals from the vertically-mounted optical fiber 228 into an adjacent, in-plane waveguide (e.g., the waveguide 56, and the slab waveguide 60) for transport into other photonic components of the first optical components 39, the second optical components 76, the third optical components 92, and the fourth optical components 186. In addition, one or more couplers of the first optical components 39, the second optical components 76, the third optical components 92, or the fourth optical components 186 may receive a second optical signal 274 (e.g., lasers with different wavelengths) from the photonic component 102. The one or more couplers of the first optical components 39, the second optical components 76, the third optical components 92, or the fourth optical components 186 may be used to receive and redirect incoming, optical signals from the photonic component 102 into adjacent, in-plane waveguides for transport into other photonic components of the first optical components 39, the second optical components 76, the third optical components 92, and the fourth optical components 186. A third optical signal 276 derived from the first optical signal 272 and/or the second optical signal 274 is routed to the first optical components 39 and the third optical components 92 to be transported along in-plane directions of the waveguides (e.g., the waveguide 56 and/or 60) of the first optical components 39 and each of the third optical components 92. A fourth optical signal 278 derived from the first optical signal 272 and/or the second optical signal 274 is routed to the first interposer 42 and transported along an in-plane direction of the patterned fourth optical components 186 (e.g., the patterned waveguides of the fourth optical components 186). The third optical signal 276 and the fourth optical signal 278 are transmitted along a light path 229 because of optical inter-coupling between neighboring waveguides (e.g., each of the third optical components 92 and the fourth optical components 186). When the horizontal distances between neighboring waveguides (e.g., each of the third optical components 92 and the fourth optical components 186) are small, e.g., when there is lateral overlapping, and also when the vertical distances between neighboring waveguides (e.g., each of the third optical components 92 and the fourth optical components 186) are small, light may optically inter-couple between the neighboring waveguides (e.g., each of the third optical components 92 and the fourth optical components 186). Accordingly, the light in each of the third optical components 92 may be optically coupled to the overlying waveguides of the first optical components 39 along the light path 229, and the light in the fourth optical components 186 may be optically coupled to the overlying waveguides of the first optical components 39 through the third optical components 92 along the light path 229. The fourth optical signal 278 is further transmitted in an in-plane direction through the fourth optical components 186 to a first region of the fourth optical components 186 that is overlapped by the package component 30. A fifth optical signal 280 derived from the fourth optical signal 278 is transmitted on to the package component 30. In this manner, optical signals received from the optical fiber 228 may be distributed through the package component 10 and further transmitted to the package component 30 through the fourth optical components 186.

Figure 27:
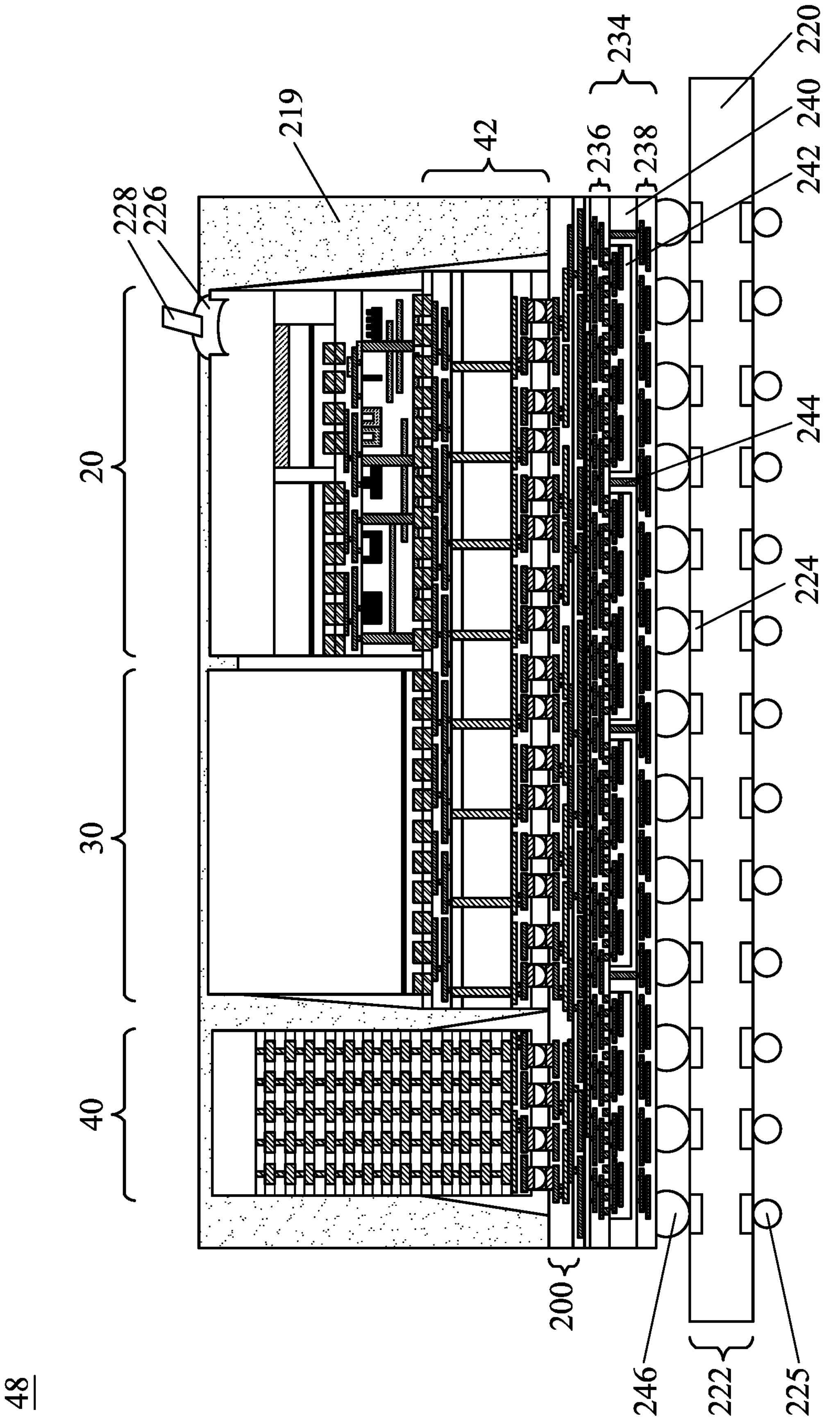
FIG. 27 illustrates a cross-sectional view of a semiconductor package, in accordance with another embodiment.

FIG. 27 illustrates a package 48, the package 48 being an alternate embodiment which may be similar to the package 47 of the FIGS. 24 through 26 where like reference numerals indicate like elements formed using like processes, unless specified otherwise. Accordingly, the process steps and applicable materials may not be repeated herein. The package 48 differs from the package 47 in that the package 48 comprises a Local Silicon Interconnect (LSI) interposer 234 instead of the second interposer 44. The LSI interposer 234 includes one or more LSI die(s) 242 built therein, or the like. Front-side RDLs 236 and backside RDLs 238 are formed on the front side and the backside of the LSI dies 242, respectively. The LSI dies 242 may be encapsulated in an encapsulant 240. Through-vias 244 may be formed to penetrate through the encapsulant 240, and may interconnect the front-side RDLs 236 and backside RDLs 238. The package component 40 and the package component 49 are electrically and physically coupled to the LSI interposer 234 through the second metallization layer 200 (described previously in FIGS. 15 to 17). Two or more package components (such as the package component 20, the package component 30, and the package component 40 may be interconnected through the metal lines built inside LSI dies 242, the second metallization layer 200, and the front-side RDLs 236. The LSI interposer 234 is coupled to the bond pads 224 on the package substrate 222 using conductive connectors 246. The conductive connectors 246 may be formed using similar processes and materials as those that were described for the formation of the conductive connectors 218 described above in FIGS. 19 and 20.

Advantageous features may be achieved by bonding the package component 49 (comprising the package component 20 and the package component 30) to the LSI interposer 234 by using bonding interconnects formed by coupling the conductive connectors 196 of the package component 49 to respective conductive connectors 214 of the LSI interposer 234. In addition, the package component 40 is bonded to the LSI interposer 234 by using bonding interconnects formed by coupling the conductive connectors 177 of the package component 40 to respective conductive connectors 214 of the LSI interposer 234. These advantages include the use of the bonding interconnects allowing for improved signal and data transmission rates accompanied by reduced power consumption. Further, using the bonding interconnects to couple the package component 49 to the LSI interposer 234, and to couple the package component 40 to the LSI interposer 234 allows for a reduction in size of the bonding interconnects, and consequently allows for a reduced size of the package 48.

In accordance with an embodiment, a semiconductor package includes a first interposer including a first substrate; first optical components over the first substrate; a first dielectric layer over the first optical components; and first conductive connectors embedded in the first dielectric layer; a photonic package bonded to a first side of the first interposer, where a first bond between the first interposer and the photonic package includes a dielectric-to-dielectric bond between a second dielectric layer on the photonic package and the first dielectric layer, and a second bond between the first interposer and the photonic package includes a metal-to-metal bond between a second conductive connector on the photonic package and a first one of the first conductive connectors; and a first die bonded to the first side of the first interposer. In an embodiment, the photonic package includes a first redistribution structure; an electronic die bonded to the first redistribution structure; and a laser diode adjacent to the electronic die and bonded to the first redistribution structure. In an embodiment, a third bond between the first interposer and the first die includes a dielectric-to-dielectric bond between a third dielectric layer on the first die and the first dielectric layer, and a fourth bond between the first interposer and the first die includes a metal-to-metal bond between a third conductive connector on the first die and a second one of the first conductive connectors. In an embodiment, the first optical components of the first interposer extend under both the first die and the photonic package. In an embodiment, the first optical components of the first interposer are optically coupled to second optical components of the photonic package. In an embodiment, the semiconductor package further includes a second interposer coupled to a second side of the first interposer using fourth conductive connectors on the second interposer and fifth conductive connectors on the first interposer, where the first side of the first interposer and the second side of the first interposer are opposite sides. In an embodiment, the semiconductor package further includes a memory device coupled to a first side of the second interposer using sixth conductive connectors on the memory device and seventh conductive connectors on the second interposer, the memory device and the first interposer being coupled to a same side of the second interposer. In an embodiment, the semiconductor package further includes a package substrate coupled to a second side of the second interposer using eighth conductive connectors. In an embodiment, the semiconductor package further includes a second die in the second interposer, where the first die, the photonic package, and the memory device are electrically interconnected through metal lines built inside the second die.

In accordance with an embodiment, a package includes a first interposer; a first package component over and bonded to a first side of the first interposer, the first package component including first optical components; and a first semiconductor die over and bonded to the first side of the first interposer, the first interposer including second optical components that are optically connected to the first optical components, where the second optical components extend under both the first package component and the first semiconductor die. In an embodiment, The package further includes a third package component coupled to a second side of the first interposer; and a fourth package component coupled to the third package component, where the third package component includes a second interposer, and the fourth package component includes a memory device. In an embodiment, the second interposer includes one or more dies that are used to electrically connect the first package component, the first semiconductor die, and the fourth package component through metal lines inside the one or more dies. In an embodiment, a first bond between the first interposer and the first package component includes a dielectric-to-dielectric bond between a first dielectric layer on the first interposer and a second dielectric layer on the first package component, and a second bond between the first interposer and the first package component includes a metal-to-metal bond between a first conductive connector on the first package component and a corresponding one of second conductive connectors on the first interposer. In an embodiment, a third bond between the first interposer and the first semiconductor die includes a dielectric-to-dielectric bond between the first dielectric layer on the first interposer and a third dielectric layer on the first semiconductor die, and a fourth bond between the first interposer and the first semiconductor die includes a metal-to-metal bond between a third conductive connector on the first semiconductor die and a corresponding one of the second conductive connectors on the first interposer. In an embodiment, the first optical components include silicon, and the second optical components include silicon nitride.

In accordance with an embodiment, a method of forming a semiconductor package includes attaching a photonic package to a first side of a first interposer, where attaching the photonic package to the first side of the first interposer includes bonding a first dielectric layer of the first interposer to a second dielectric layer of the photonic package using dielectric-to-dielectric bonds, and bonding first conductive connectors of the photonic package to corresponding ones of second conductive connectors of the first interposer using metal-to-metal bonds; and attaching a semiconductor die to the first side of the first interposer, where attaching the semiconductor die to the first side of the first interposer includes bonding the first dielectric layer of the first interposer to a third dielectric layer of the semiconductor die using dielectric-to-dielectric bonds, and bonding third conductive connectors of the semiconductor die to corresponding ones of the second conductive connectors of the first interposer using metal-to-metal bonds. In an embodiment, the photonic package includes first optical components; a first redistribution structure over the first optical components; an electronic die bonded to the first redistribution structure; and a laser diode adjacent to the electronic die and bonded to the first redistribution structure. In an embodiment, the method further includes coupling a first side of a second interposer to a second side of the first interposer, the second side of the first interposer being opposite the first side of the first interposer; and coupling a memory device to the first side of the second interposer. In an embodiment, the method further includes coupling a package substrate to a second side of the second interposer using fourth conductive connectors. In an embodiment, coupling the first side of the second interposer to the second side of the first interposer includes a reflowing process to bond fifth conductive connectors on the second interposer to sixth conductive connectors on the first interposer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package comprising:

a first interposer comprising:

a first substrate;

first optical components over the first substrate;

a first dielectric layer over the first optical components; and first conductive connectors embedded in the first dielectric layer;

a photonic package bonded to a first side of the first interposer, wherein a first bond between the first interposer and the photonic package comprises a dielectric-to-dielectric bond between a second dielectric layer on the photonic package and the first dielectric layer, and a second bond between the first interposer and the photonic package comprises a metal-to-metal bond between a second conductive connector on the photonic package and a first one of the first conductive connectors; and a first die bonded to the first side of the first interposer.

2. The semiconductor package of claim 1, wherein the photonic package comprises:

a first redistribution structure;

an electronic die bonded to the first redistribution structure; and a laser diode adjacent to the electronic die and bonded to the first redistribution structure.

3. The semiconductor package of claim 1, wherein a third bond between the first interposer and the first die comprises a dielectric-to-dielectric bond between a third dielectric layer on the first die and the first dielectric layer, and a fourth bond between the first interposer and the first die comprises a metal-to-metal bond between a third conductive connector on the first die and a second one of the first conductive connectors.

4. The semiconductor package of claim 1, wherein the first optical components of the first interposer extend under both the first die and the photonic package.

5. The semiconductor package of claim 1, wherein the first optical components of the first interposer are optically coupled to second optical components of the photonic package.

6. The semiconductor package of claim 1, further comprising:

a second interposer coupled to a second side of the first interposer using fourth conductive connectors on the second interposer and fifth conductive connectors on the first interposer, wherein the first side of the first interposer and the second side of the first interposer are opposite sides.

7. The semiconductor package of claim 6, further comprising:

a memory device coupled to a first side of the second interposer using sixth conductive connectors on the memory device and seventh conductive connectors on the second interposer, the memory device and the first interposer being coupled to a same side of the second interposer.

8. The semiconductor package of claim 7, further comprising:

a package substrate coupled to a second side of the second interposer using eighth conductive connectors.

9. The semiconductor package of claim 7, further comprising:

a second die in the second interposer, wherein the first die, the photonic package, and the memory device are electrically interconnected through metal lines built inside the second die.

10. A package comprising:

a first interposer;

a first package component over and bonded to a first side of the first interposer, the first package component comprising first optical components; and a first semiconductor die over and bonded to the first side of the first interposer, the first interposer comprising second optical components that are optically connected to the first optical components, wherein the second optical components extend under both the first package component and the first semiconductor die.

11. The package of claim 10, further comprising:

a third package component coupled to a second side of the first interposer; and a fourth package component coupled to the third package component, wherein the third package component comprises a second interposer, and the fourth package component comprises a memory device.

12. The package of claim 11, wherein the second interposer comprises one or more dies that are used to electrically connect the first package component, the first semiconductor die, and the fourth package component through metal lines inside the one or more dies.

13. The package of claim 10, wherein a first bond between the first interposer and the first package component comprises a dielectric-to-dielectric bond between a first dielectric layer on the first interposer and a second dielectric layer on the first package component, and a second bond between the first interposer and the first package component comprises a metal-to-metal bond between a first conductive connector on the first package component and a corresponding one of second conductive connectors on the first interposer.

14. The package of claim 13, wherein a third bond between the first interposer and the first semiconductor die comprises a dielectric-to-dielectric bond between the first dielectric layer on the first interposer and a third dielectric layer on the first semiconductor die, and a fourth bond between the first interposer and the first semiconductor die comprises a metal-to-metal bond between a third conductive connector on the first semiconductor die and a corresponding one of the second conductive connectors on the first interposer.

15. The package of claim 10, wherein the first optical components comprise silicon, and the second optical components comprise silicon nitride.

16. A semiconductor package comprising:

a photonic package bonded to a first side of a first interposer, wherein a first bond between the first interposer and the photonic package comprises a dielectric-to-dielectric bond between a first dielectric layer on the photonic package and a second dielectric layer of the first interposer, and a second bond between the first interposer and the photonic package comprises a metal-to-metal bond between a first conductive connector on the photonic package and a second conductive connector of the first interposer, wherein the second conductive connector is embedded in the second dielectric layer;

a first die bonded to the first side of the first interposer; and a second interposer coupled to a second side of the first interposer, wherein a width of the second interposer is greater than a width of the first interposer.

17. The semiconductor package of claim 16, wherein the photonic package comprises:

first optical components;

a first redistribution structure over the first optical components;

an electronic die bonded to the first redistribution structure; and a laser diode adjacent to the electronic die and bonded to the first redistribution structure.

18. The semiconductor package of claim 16, further comprising a memory device coupled to a first side of the second interposer using third conductive connectors.

19. The semiconductor package of claim 18, further comprising:

a package substrate coupled to a second side of the second interposer using fourth conductive connectors, wherein the first side of the second interposer and the second side of the second interposer are opposite sides of the second interposer.

20. The semiconductor package of claim 19, wherein a width of the package substrate is greater than a width of the second interposer.

* * * * *